United States Patent
Kim et al.

(10) Patent No.: US 10,231,349 B2
(45) Date of Patent: *Mar. 12, 2019

(54) DISPLAY DEVICE

(71) Applicant: LG ELECTRONICS INC., Seoul (KR)

(72) Inventors: Yooseok Kim, Seoul (KR); Byungmu Huh, Seoul (KR); Seokbong Han, Seoul (KR); Jongyoun Shin, Seoul (KR); Sunha Park, Seoul (KR); Younsoo Kim, Seoul (KR); Misun Park, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/617,886

(22) Filed: Jun. 8, 2017

(65) Prior Publication Data

US 2017/0273200 A1   Sep. 21, 2017

Related U.S. Application Data

(63) Continuation of application No. 15/172,989, filed on Jun. 3, 2016, now Pat. No. 9,713,272.

(30) Foreign Application Priority Data

Oct. 26, 2015  (KR) .................. 10-2015-0148924
Oct. 26, 2015  (KR) .................. 10-2015-0148939

(51) Int. Cl.
*G06F 1/16*       (2006.01)
*H05K 5/02*       (2006.01)
(Continued)

(52) U.S. Cl.
CPC .......... *H05K 5/0204* (2013.01); *F16M 13/02* (2013.01); *G02F 1/133308* (2013.01);
(Continued)

(58) Field of Classification Search
CPC .. H05K 5/0204; H05K 5/0017; G06F 1/1656; F16M 13/02; H01L 51/5237
See application file for complete search history.

(56) References Cited

U.S. PATENT DOCUMENTS 4,287,676 A   9/1981  Weinhaus
6,135,408 A   10/2000 Richter
(Continued)

FOREIGN PATENT DOCUMENTS

CN   1761819 A      4/2006
CN   202613002 U   12/2012
(Continued)

OTHER PUBLICATIONS

European Search Report, dated Dec. 1, 2016 for European patent application No. 16179891.3, 8 pages.
(Continued)

*Primary Examiner* — Adrian S Wilson
(74) *Attorney, Agent, or Firm* — Dentons US LLP

(57) ABSTRACT

A display device includes a display panel, a back cover placed in the back surface of the display panel, and a coupling unit placed in an area between the back cover and the display panel. The display device can be closely coupled to a to-be-attached surface.

20 Claims, 66 Drawing Sheets

(51) Int. Cl.
*F16M 13/02* (2006.01)
*H01L 51/52* (2006.01)
*H05K 5/00* (2006.01)
*G02F 1/1333* (2006.01)

(52) U.S. Cl.
CPC ........ *G06F 1/1656* (2013.01); *H01L 51/5237* (2013.01); *H05K 5/0017* (2013.01); *G02F 2001/133314* (2013.01)

(56) References Cited

U.S. PATENT DOCUMENTS

| | | |
|---|---|---|
| 6,400,560 B1 | 6/2002 | Chian |
| 6,418,010 B1 | 7/2002 | Sawyer |
| 6,437,975 B1 | 8/2002 | Huang |
| 6,532,152 B1 | 3/2003 | White |
| 7,070,156 B2 | 7/2006 | Liao |
| 7,120,010 B2 | 10/2006 | Tajima |
| 7,295,429 B2 | 11/2007 | Jackson, Jr. |
| 7,541,907 B2 | 6/2009 | Wang |
| 7,564,682 B2 | 7/2009 | Liou |
| 7,988,121 B2 | 8/2011 | Kameoka |
| 8,102,483 B2 | 1/2012 | Perry |
| 8,143,983 B1 | 3/2012 | Lauder |
| 8,350,984 B2 | 1/2013 | Perry |
| 8,610,523 B2 | 12/2013 | Ku |
| 9,010,699 B2 | 4/2015 | Anderson |
| 9,713,272 B2 * | 7/2017 | Kim ................ G02F 1/133308 |
| 2005/0001949 A1 | 1/2005 | Kawamoto |
| 2005/0028417 A1 | 2/2005 | Kim |
| 2006/0237604 A1 | 10/2006 | Tan |
| 2006/0242876 A1 | 11/2006 | Davide |
| 2007/0002529 A1 | 1/2007 | Drew |
| 2007/0046837 A1 | 3/2007 | Elberbaum |
| 2007/0121280 A1 | 5/2007 | Yang |
| 2007/0194191 A1 | 8/2007 | Persson |
| 2007/0258196 A1 | 11/2007 | Koskinen |
| 2008/0218952 A1 | 9/2008 | Benn |
| 2009/0225504 A1 | 9/2009 | Wu |
| 2010/0146308 A1 | 6/2010 | Gioscia |
| 2014/0198474 A1 | 7/2014 | Byeon et al. |
| 2014/0347795 A1 | 11/2014 | Baca |
| 2015/0076308 A1 | 3/2015 | Hung |
| 2016/0309599 A1 | 10/2016 | Kikuchi |

FOREIGN PATENT DOCUMENTS

| | | |
|---|---|---|
| JP | 2013148925 A | 8/2013 |
| KR | 20070120672 A | 12/2007 |
| KR | 20140035120 A | 3/2014 |
| TW | 201510404 A | 3/2015 |
| WO | 2007/19967 A1 | 10/2007 |

OTHER PUBLICATIONS

International Search Report, dated Aug. 31, 2016 for the PCT application No. PCT/KR2016/005764, 3 pages.

* cited by examiner

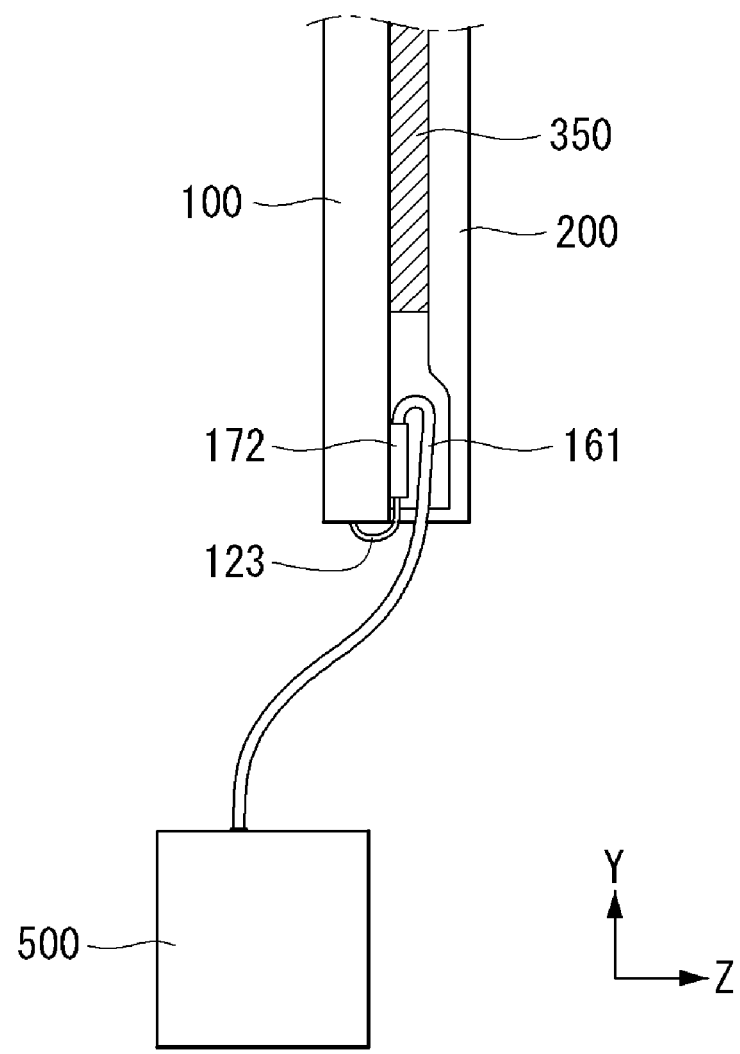

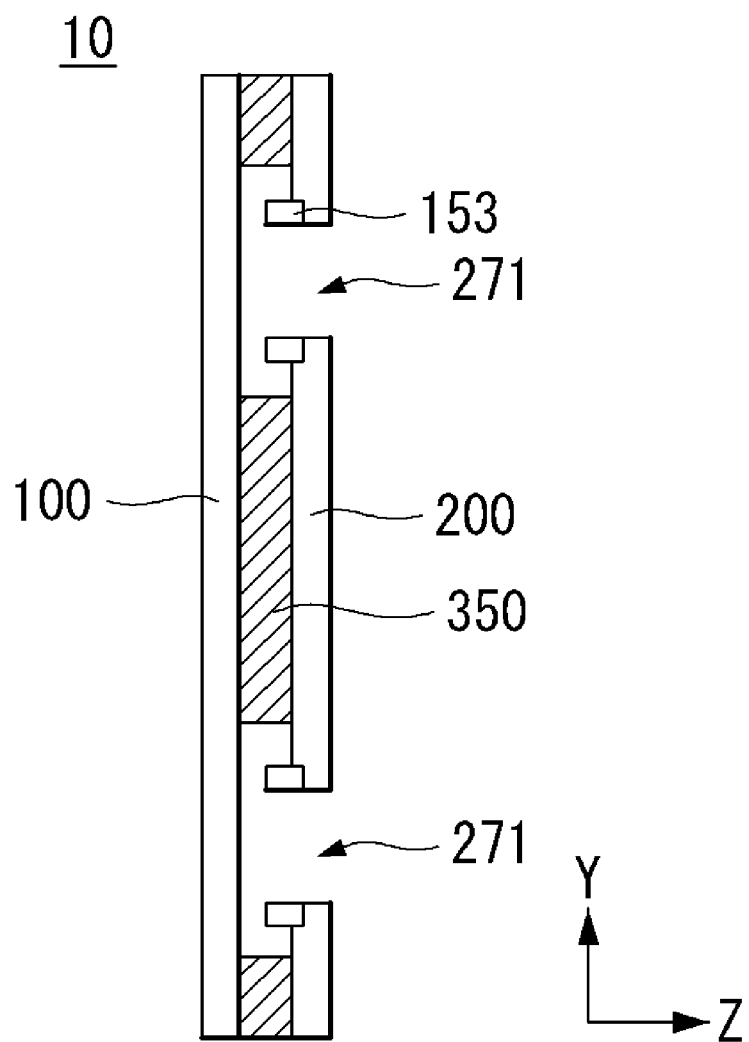

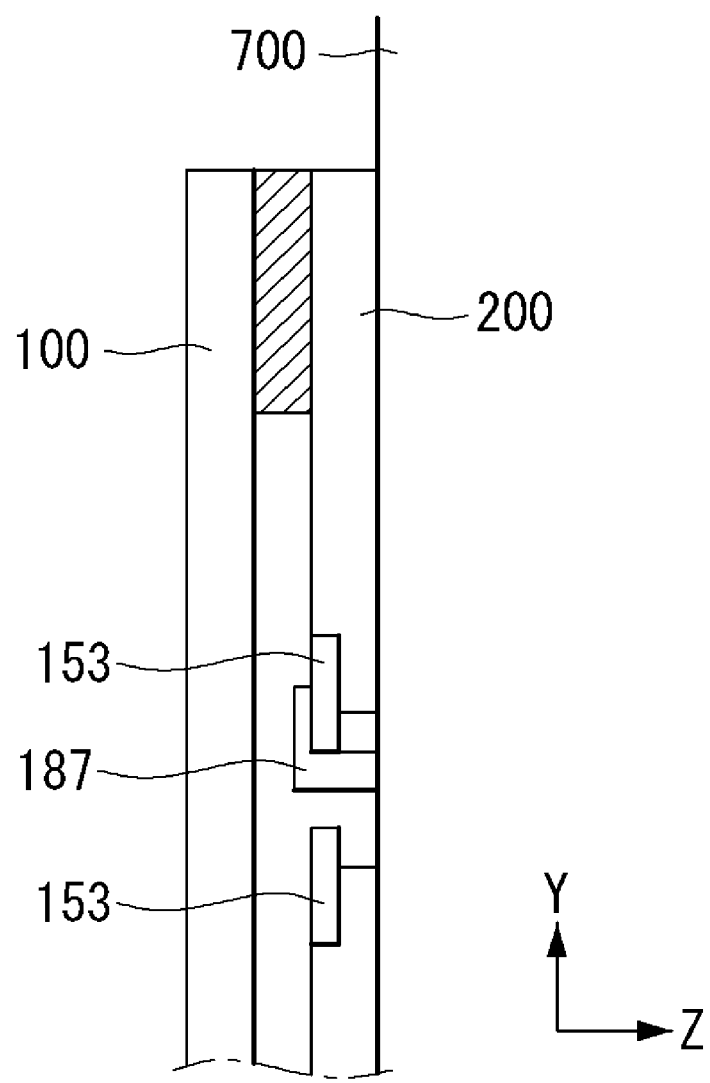

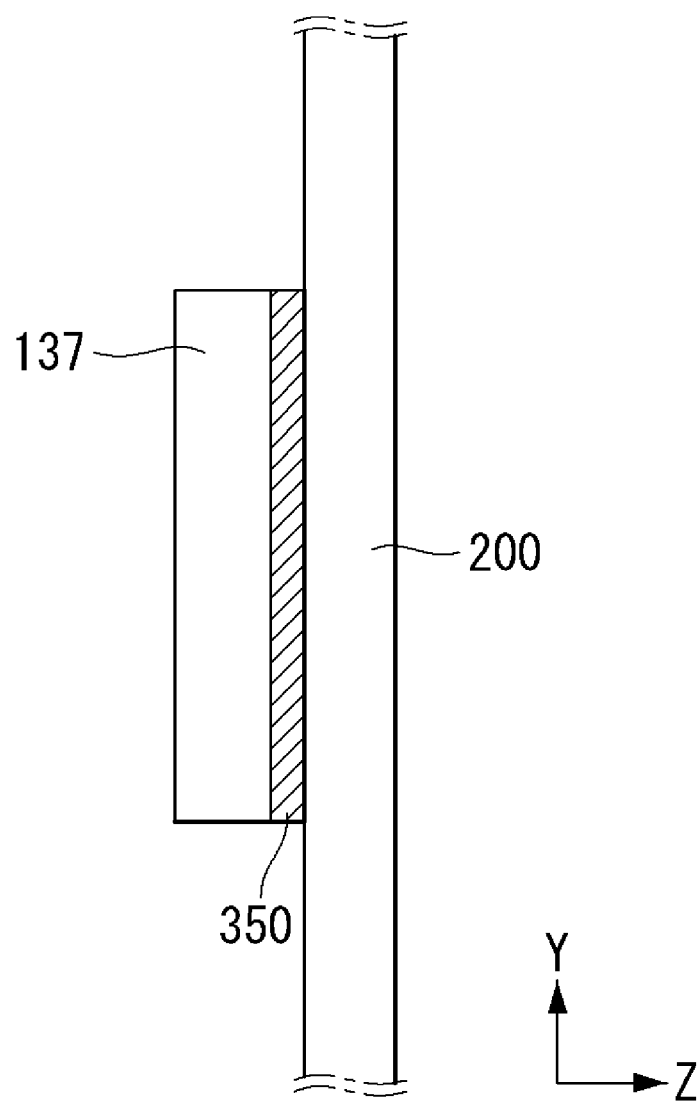

DISPLAY DEVICE

This application is a Continuation Application of U.S. patent application Ser. No. 15/172,989, filed on Jun. 3, 2016, which claims the benefit of Korean Patent Application Nos. 10-2015-0148924 and 10-2015-0148939, filed on Oct. 26, 2015, all of which are hereby incorporated by reference in their entirety for all purposes as if fully set forth herein.

CROSS-REFERENCE TO RELATED APPLICATIONS

This application claims the benefit of Korean Patent Application Nos. 10-2015-0148924 and 10-2015-0148939 filed on Oct. 26, 2015, the entire contents of which are incorporated herein by reference for all purposes as if fully set forth herein.

BACKGROUND

Field of the Disclosure

The present disclosure relates to a display device and, more particularly, to a display device in which a body coupling unit does not protrude to the outside of a back cover so that a body is closely attached to a to-be-attached surface.

Background

As the information society develops, a demand for a display device increases in various forms. In line with such a demand, various display devices, such as a liquid crystal display device (LCD), a plasma display panel (PDP), an electroluminescent display (LED), and a vacuum fluorescent display (VFD), have been researched and used.

In the various display devices, a display device using organic light-emitting diodes (OLED) is advantageous in that it has an excellent brightness characteristic and viewing angle characteristic, and can be implemented as an ultra-thin type because it does not require a backlight unit, compared to the LCD.

SUMMARY

In accordance with one aspect, a display device includes a display; a back cover placed in a back surface of the display panel; and a first coupling unit placed in an area between the back cover and the display panel.

The first coupling unit includes a metal plate having a frame shape and the metal plate is provided at the sides of the display panel.

The back cover includes an opening around at least one side of the back cover corresponding to the at least one side of the metal plate.

The display device further includes another metal plate attachable to a surface, where at least one of the metal plate in the display device and the another metal plate is magnetic.

The another metal plate further includes a hook.

The display device further includes a groove formed at an upper central part of the back cover, where a hanger is placed within the groove.

In another aspect, the back cover includes at least one opening formed in the back cover and the first coupling unit is placed in an area in the display device corresponding to the opening of the back cover and is placed between the back cover and the display panel.

The at least one opening of the back cover extends lengthwise and the first coupling unit correspondingly extends lengthwise.

The first coupling unit includes a magnetic material, a metal material, an adhesive, or Velcro.

The display device further includes a second coupling unit attachable to a surface, where the second coupling unit is insertable into the at least one opening of the back cover to couple with the first coupling unit.

The at least one opening of the back cover includes at least two openings placed on upper and lower sides of the back cover.

The at least one opening of the back cover includes at least two openings placed on either side of the back cover.

A bracket may be placed at a boundary area of the at least one opening of the back cover.

A thickness of the boundary area of the at least one opening is thinner than a thickness at another area of the back cover, and the bracket is placed in the boundary area of the at least one opening.

The bracket is exposed from the at least one opening of the back cover and protrudes in a direction parallel to a back surface of the back cover.

According to another aspect, a display device includes a display unit; and an attachment unit to attach the display unit to a surface, where the display unit includes: a display panel; a back cover placed in a back surface of the display panel and to have at least one opening formed in the back cover; and a first coupling unit placed in an area between the back cover and the display panel. The attachment unit includes: at least one hook placed to a first area of the surface, to be insertable into the at least one opening of the back cover; and a second coupling unit placed to a second area of the surface and to be coupled with the first coupling unit in the display unit through the at least one opening of the back cover.

The display unit further includes a bracket placed in a boundary area of the at least one opening of the back cover.

The opening of the back cover includes at least two openings placed on upper and lower sides of the back cover.

The at least one opening of the back cover includes two openings placed on either side of the back cover and the first coupling unit includes a one-side coupling unit and an other-side coupling unit placed in areas corresponding to the two openings placed on either side of the back cover, respectively.

The at least one opening further includes another opening between the two openings placed on either side of the back cover, the another opening to receive the hook of the attachment unit.

The first coupling unit includes a magnetic material, a metal material, an adhesive, or Velcro.

According to another aspect, first coupling unit includes a metal plate having a frame shape and the metal plate is provided at sides of the display panel.

The attachment unit includes the second coupling unit having a frame shape and the hook is at a bottom of the upper portion of the second coupling unit in the central part. At least one of the first coupling unit and the second coupling unit is magnetic.

BRIEF DESCRIPTION OF THE DRAWINGS

The accompanying drawings, which are included to provide a further understanding of the disclosure and are incorporated in and constitute a part of this specification, illustrate embodiments of the invention and together with the description serve to explain the principles of the invention. In the drawings:

FIGS. 1, 2, 3(a), 3(b), 3(c), 3(d), 4(a), 4(b), 4(c), 5(a), 5(b), 6(a), 6(b), 6(c), 7(a), 7(b), 8(a), and 8(b) are diagrams showing the configurations of display devices according to various embodiments of the present invention;

FIGS. 9(a), 9(b), 9(c), 10(a), 10(b), 10(c), 11, 12(a), 12(b), 12(c), 13(a), 13(b), 13(c), 14(a), 14(b), 15(a), 15(b), 16(a), 16(b), 17(a), 17(b), 18(a), 18(b), 18(c), 19(a) and 19(b) are diagrams showing a display device according to various embodiments of the present invention;

FIGS. 24, 25(a), 25(b), 26(a), 26(b), 27(a), 27(b), 27(c), 28(a), 28(b), 29(a), 29(b), 30(a), and 30(b) are diagrams showing a display device according to various embodiments of the present invention.

DETAILED DESCRIPTION OF THE EMBODIMENTS

Figure 1:
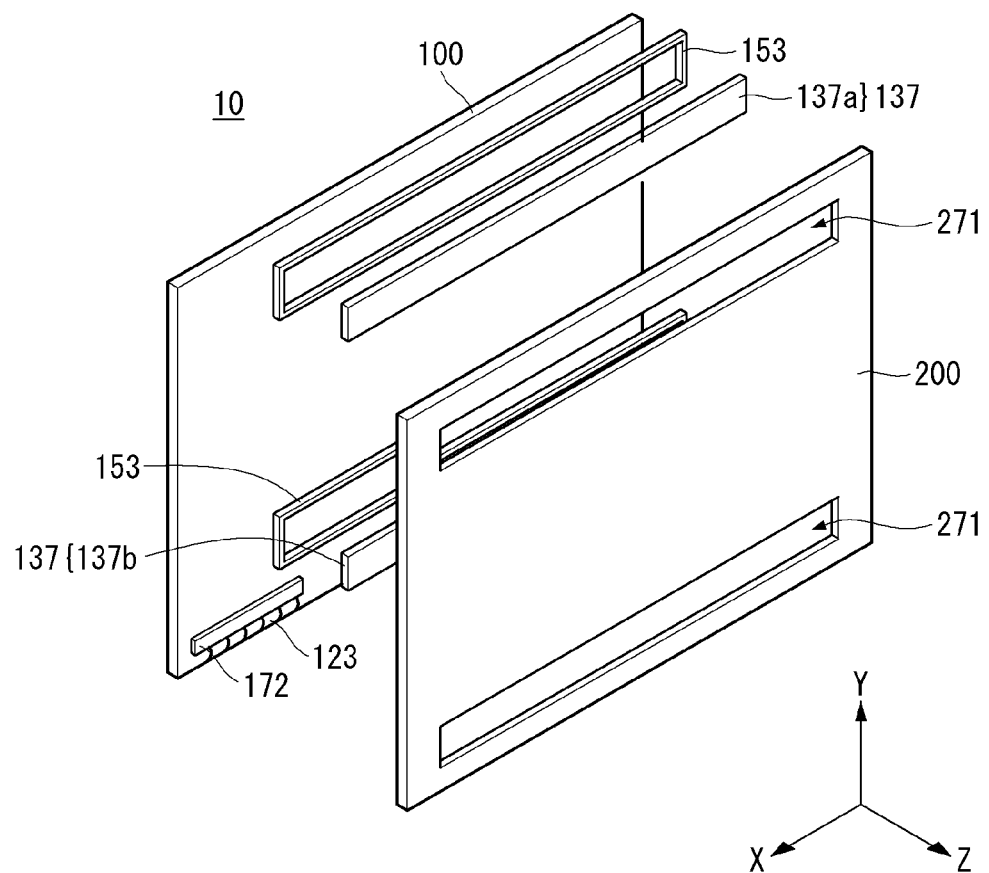

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc., may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of a plurality of related items disclosed and any item from among the plurality of related items disclosed.

When an arbitrary component is described as "being connected to (or being coupled to)" another component, this should be understood to mean that still another component(s) may exist between them, although the arbitrary component may be directly connected (or coupled to) the second component. In contrast, when an arbitrary component is described as "being directly connected to (or being directly coupled to)" another component, this should be understood to mean that no component exists between them.

The terms used in the present application are used to describe only specific embodiments or examples, and are not intended to limit the present invention. A singular expression may include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention. Accordingly, shapes and sizes of elements shown in the drawings may be exaggerated for clarity.

Hereinafter, a display panel is described by taking an organic light-emitting diode (OLED) display device as an example, but a display panel applicable to an embodiment of the present invention is not limited thereto and may include a liquid crystal display (LCD) device, a plasma display panel (PDP), and a field emission display (FED).

Furthermore, hereinafter, a display panel 100 may include a first long side, a second long side opposite the first long side, a first short side neighboring the first long side and the second long side, and a second short side opposite the first short side.

In this case, the area of the first short side may be called a first side area. The area of the second short side may be called a second side area opposite the first side area. The area of the first long side may be called a third side area which neighbors the first side area and the second side area and which is placed between the first side area and the second side area. The area of the second long side may be called a fourth side area which neighbors the first side area and the second side area, which is placed between the first side area and the second side area, and which is opposite the third side area.

Furthermore, for convenience of description, the length of the first or second long side has been illustrated as being longer than the length of the first or second short side, but the length of the first or second long side may be approximately the same as the length of the first or second short side.

Furthermore, hereinafter, a first direction DR1 may be a direction parallel to the long side of the display panel 100, and a second direction DR2 may be a direction parallel to the short side of the display panel 100.

A third direction DR3 may be a direction orthogonal to the first direction DR1 and/or the second direction DR2.

The first direction DR1 and the second direction DR2 may be called a horizontal direction and a vertical direction.

Furthermore, the third direction DR3 may be called an orthogonal direction.

In an embodiment of the present invention, the first direction may be an X direction, for example. The second direction may be a Y direction, for example. The third direction may be a Z direction.

FIGS. 1, 2, 3(a), 3(b), 3(c), 3(d), 4(a), 4(b), 4(c), 5(a), 5(b), 6(a), 6(b), 6(c), 7(a), 7(b), 8(a), and 8(b) are diagrams showing the configurations of display devices according to various embodiments of the present invention.

Referring to FIG. 1, the body 10 of the display device according to an embodiment of the present invention may include the display panel 100, a bracket 153, a first coupling unit 137, and a back cover 200.

The display panel 100 is at the front of the body 10, and includes an image forming layer to display an image. As an example, the image forming layer may include a plurality of pixels, and the display device may control the pixels so that a pixel emits light according to its color, luma, and chroma, and thereby displaying the image. As another example, the image forming layer may include liquid crystals, and the display device may control the liquid crystals so that an image is formed.

The display panel 100 may be a rectangle, but the present invention is not limited thereto. The display panel 100 may have a shape having curvature in its edge. The display panel 100 may be an OLED panel, but the present invention is not limited thereto. For instance, the display panel 100 may be an LCD panel.

One or more source PCBs 172 may be placed in at least part of the back surface of the display panel 100. The one or more source PCBs 172 may be spaced apart from each other.

Signal lines for sending digital video data and timing control signals received from a timing controller board may be placed in at least one source PCB 172. The source PCB 172 may be connected to the display panel 100 by a source chip on film (COF) 123. The source COF 123 connected to one side of the source PCB 172 may be extended to the bottom of the display panel 100 and may be connected to the display panel 100.

The back cover 200 may be provided on the back surface of the display panel 100. The back cover 200 may be directly attached to the display panel 100. The back cover 200 may support the back surface of the display panel 100. That is, the back cover 200 may reinforce the stiffness of the display panel 100. Accordingly, the back cover 200 may include a material which is light and has high strength. For example, the back cover 200 may include aluminum.

Coupling holes (openings) 271 may be placed on one side and another side of the back cover 200. For example, the coupling holes 271 may be placed on the upper side and lower side of the back cover 200. The coupling holes 271 may face each other using the first direction as an axis in the central part of the back cover 200. The coupling holes 271 may penetrate the back cover 200. The coupling hole 271 may have a shape extending in the first direction.

The bracket 153 and the first coupling unit 137 may be placed between the display panel 100 and the back cover 200. The first coupling unit 137 may include a magnetic material. However, the present invention is not limited thereto. For example, the first coupling unit 137 may be an adhesive sheet or Velcro. The bracket 153 and the first coupling unit 137 may be placed in a part corresponding to the coupling hole 271 of the back cover 200.

The bracket 153 may be a frame having an opening at the central part. The bracket 153 may reinforce the stiffness of the coupling hole (271) portion of the back cover 200. Accordingly, the bracket 153 may be attached to the boundary of the coupling hole 271 of the back cover 200. For instance, the bracket 153 may be placed in the boundary of the coupling hole 271. When the display panel 100 and the back cover 200 are coupled, the bracket 153 may help the coupling hole 271 from being cracked, warped or damaged. The bracket 153 may include a metallic material or a non-metallic material, such as rubber or plastic, in order to reinforce the stiffness of the coupling hole 271.

The first coupling unit 137 may be placed in at least one of the coupling holes 271 of the back cover 200 of the display panel 100. The first coupling unit 137 may be placed in the central part of the bracket 153. The first coupling unit 137 may be placed in a portion surrounded by the bracket 153 and the coupling hole 271, but the present invention is not limited thereto. The first coupling unit 137 may deviate from a portion corresponding to the bracket 153 and the coupling hole 271. This is described later.

The first coupling unit 137 may include a first portion of the first coupling unit 137a and a second portion of the first coupling unit 137b. The first portion of the first coupling unit 137a and the second portion of the first coupling unit 137b may be spaced apart from each other. A spaced portion between the first portion of the first coupling unit 137a and the second portion of the first coupling unit 137b may be a portion into which a hook to be described later may be inserted. The first portion of the first coupling unit 137a may be placed on one side of the body 10. The second portion of the first coupling unit 137b may be placed on the other side of the body 10 facing the first portion of the first coupling unit 137a in the second direction.

The first coupling unit 137 may include a magnetic material. The first coupling unit 137 may be attached to the back surface of the display panel 100. The first coupling unit 137 may be coupled to the display panel 100 using a screw, but the present invention is not limited thereto. The first coupling unit 137 may be coupled to the display panel 100 using adhesives.

Figure 2:
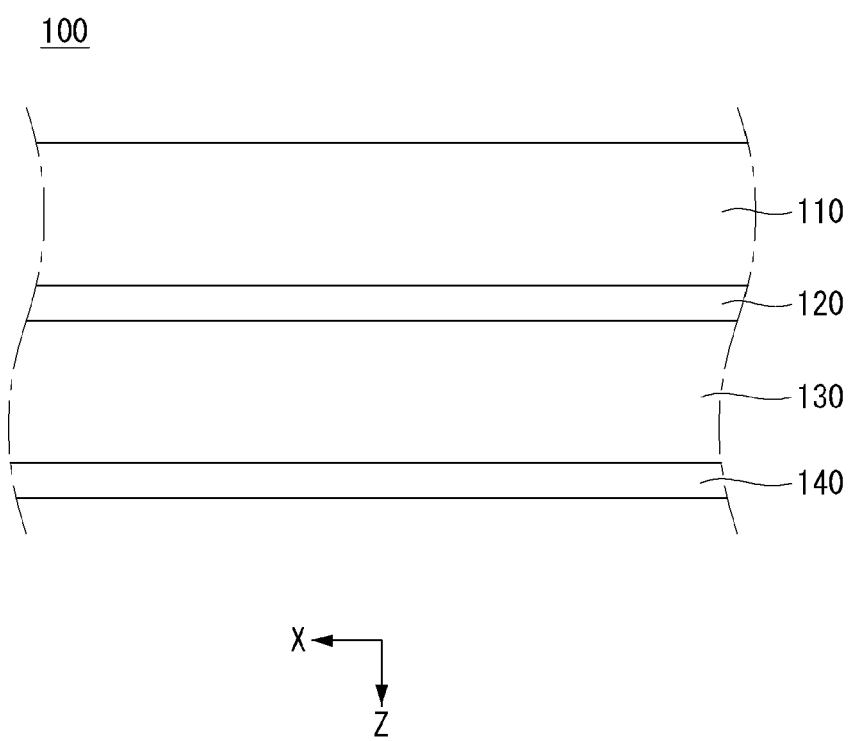
Figure 3A:
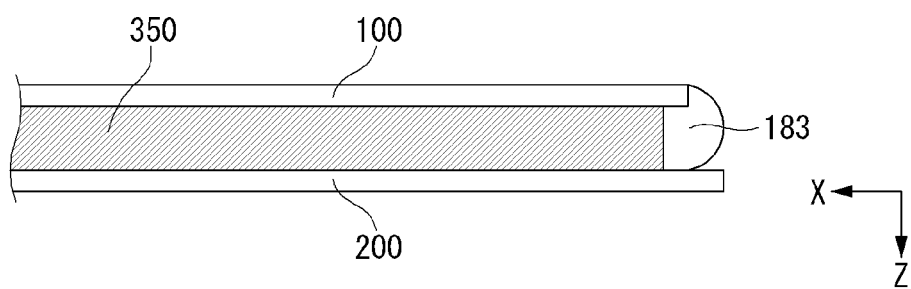
Figure 3B:
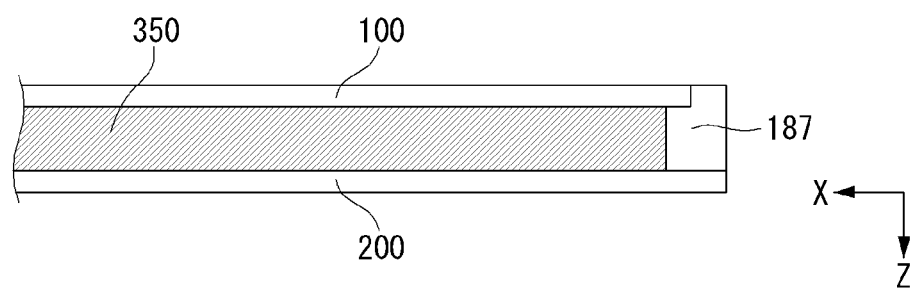
Figure 3C:
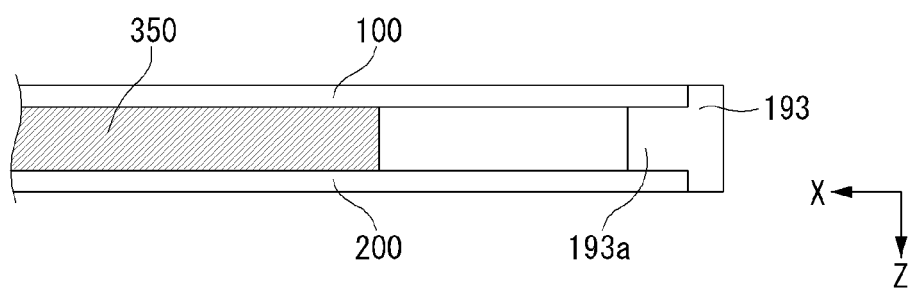
Figure 3D:
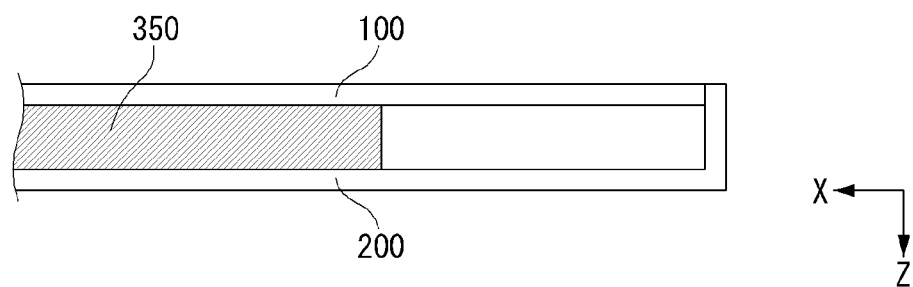
Figure 4A:
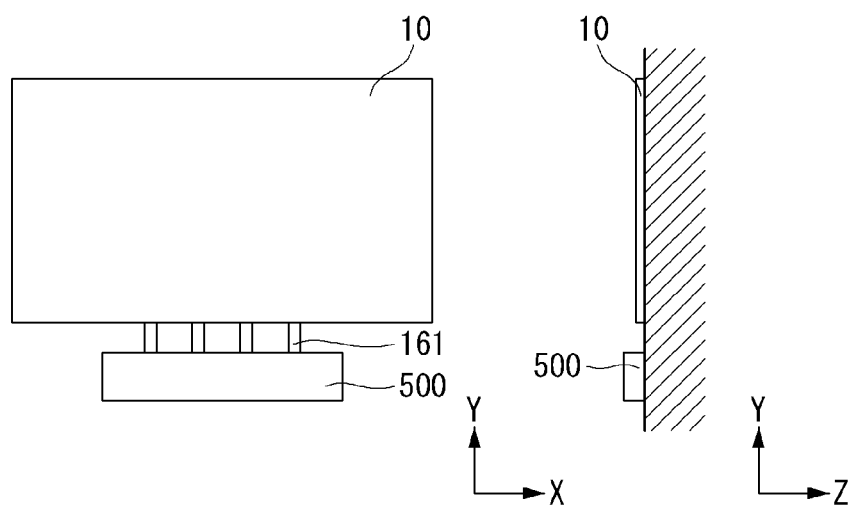
Figure 4B:
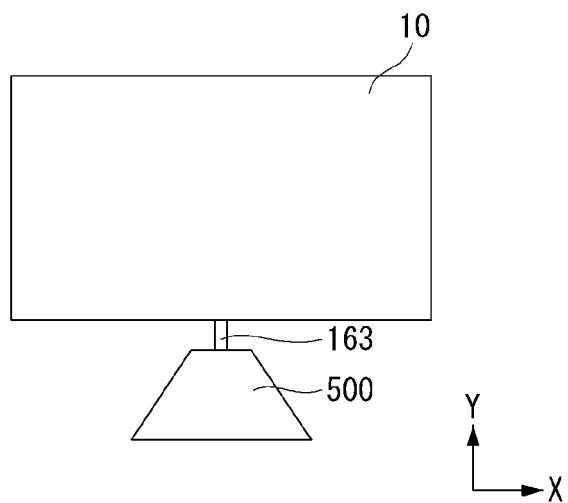
Figure 4C:
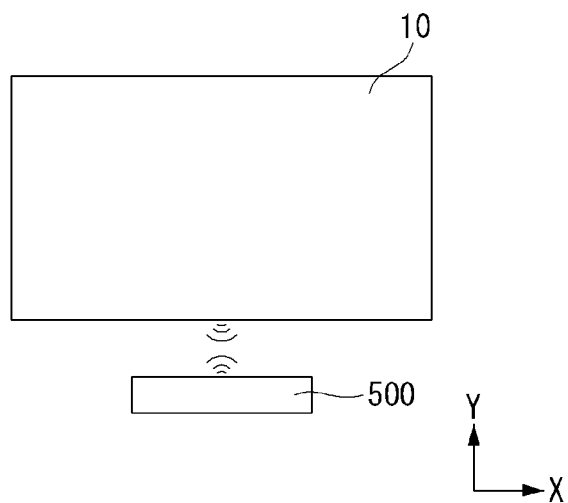
Figure 5A:
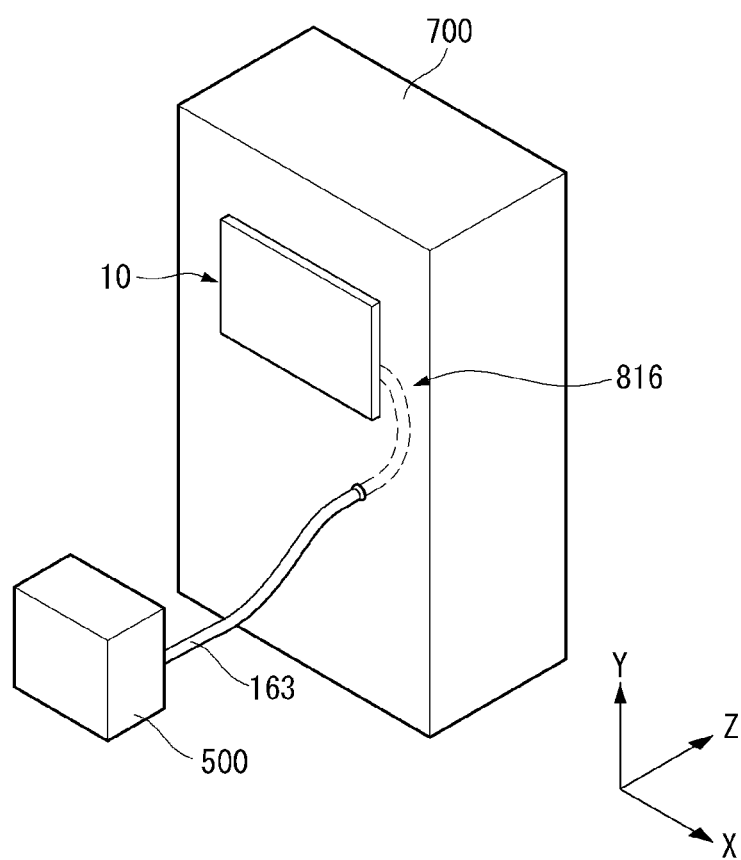
Figure 5B:
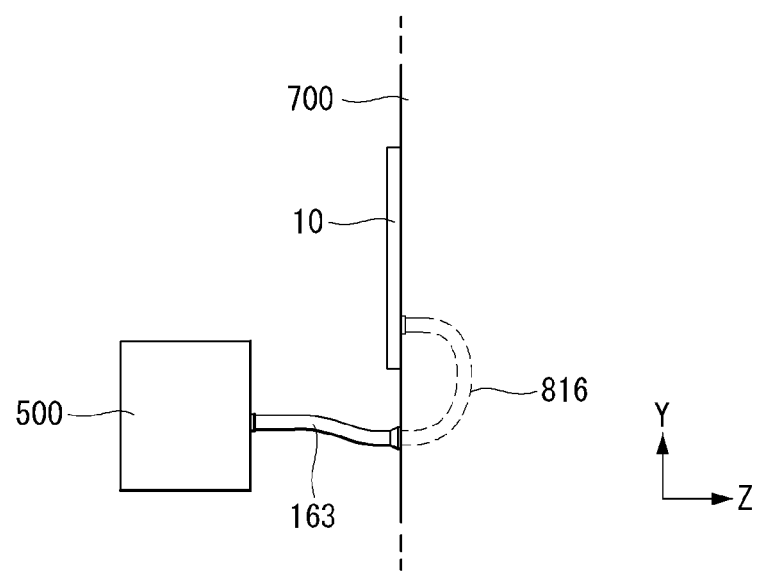
Figure 6A:
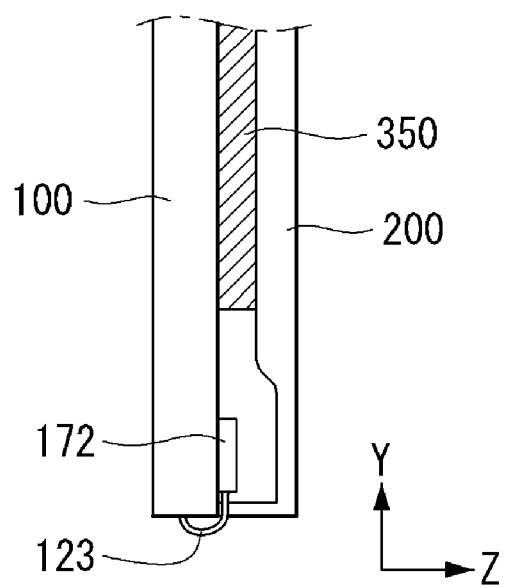
Figure 6B:
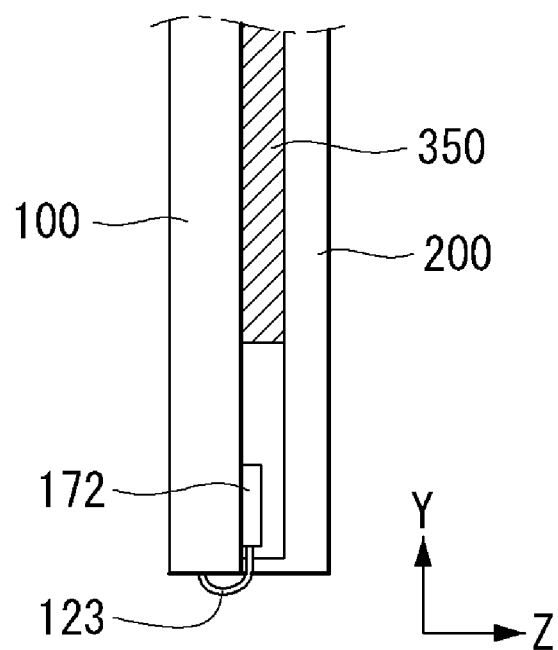

Referring to FIG. 2, the display panel 100 may include a transparent substrate 110, an upper electrode 120, an organic light-emitting layer 130, and a lower electrode 140. The transparent substrate 110, the upper electrode 120, the organic light-emitting layer 130, and the lower electrode 140 may be sequentially formed.

The transparent substrate 110 and the upper electrode 120 may include a transparent material. The lower electrode 140 may include a non-transparent material, but the present invention is not limited thereto. The lower electrode 140 may include a transparent material (e.g., ITO). In this case, light may pass through the lower electrode 140.

When voltage is applied to the upper and lower electrodes 120 and 140, light emitted from the organic light-emitting layer 130 may pass through the upper electrode 120 and the transparent substrate 110 and may be then externally outputted from the display panel 100. In the case where the lower electrode 140 includes a transparent material, a light shield plate may be further formed behind the lower electrode 140 in order to reflect light, passed through the lower electrode 140, to the front of the display panel 100.

The display device according to an embodiment of the present invention may be an OLED display device. Accordingly, a separate light source is not required, and the volume and weight of the display device can be reduced. Furthermore, the OLED display device may not have a residual image (e.g., phantom image) when displaying an image because it has response speed which is 1000 times faster than that of an LCD device.

Referring to FIGS. 3(*a*)-3(*d*), the display panel 100 and back cover 200 of the display device according to various embodiments of the present invention may be attached through an adhesive sheet 350. The adhesive sheet 350 may include a double-sided tape capable of bonding on both sides.

The adhesive sheet 350 may have a thickness. Accordingly, an alien substance or dust may enter between the display panel 100 and the back cover 200. In order to prevent an alien substance or dust from entering between the display panel 100 and the back cover 200, a sealing member 183 may be used to seal at least one side of the adhesive sheet 350, as shown in FIG. 3(*a*). The sealing member 183 may simultaneously shield one or more sides of the adhesive sheet 350 and the display panel 100.

As an example, as shown in FIG. 3(*b*), a frame 187 may be inserted into at least one side of the adhesive sheet 350. The frame 187 may come into contact with at least one side of the adhesive sheet 350 and may have one end indented so that it extends over an end of the display panel 100. Accordingly, one or more sides of the display panel 100 can be simultaneously shielded.

As another example, as shown in FIG. 3(*c*), a middle cabinet 193 may be placed between the display panel 100 and the back cover 200. The middle cabinet 193 may guide the location in which the display panel 100 is coupled. The flange 193*a* of the middle cabinet 193 may be inserted between the display panel 100 and the back cover 200. The body part of the middle cabinet 193 may simultaneously shield one or more sides of the display panel 100 and the back cover 200.

The flange 193*a* of the middle cabinet 193 may be spaced apart from the adhesive sheet 350. Accordingly, the amount of the adhesive sheet 350 required when the display device is manufactured can be reduced because the adhesive sheet 350 does not need to be generally placed completely in the display panel 100.

As yet another example, as shown in FIG. 3(*d*), the edge portion of the back cover 200 may bent toward the display panel 100. Accordingly, at least one side of the adhesive sheet 350 can be shielded from the outside because the edge portion of the back cover 200 is bent toward the display panel 100.

In this case, a separate material need not be included between the display panel 100 and the back cover 200. Accordingly, the manufacturing process of the display device can be simplified, and a cost can be reduced. Furthermore, the edge portion of the back cover 200 may be spaced apart from the adhesive sheet 350. Accordingly, the amount of the adhesive sheet 350 required when the display device is manufactured can be reduced because the adhesive sheet 350 does not need to be generally placed completely in the display panel 100.

In embodiments to be described later, structures placed on the side of the adhesive sheet 350 are omitted, for convenience of description. The structures placed on the side of the adhesive sheet 350 may also be applied to other embodiments.

Referring to FIGS. 4(*a*)-4(*c*), a display device according to various embodiments of the present invention may include a housing 500 electrically connected to the body 10.

The housing 500 may send at least one signal to the body 10. The housing 500 may shield elements for driving the display device. For example, the housing 500 may shield at least one printed circuit board (PCB). A detailed coupling structure and method of the at least one PCB are described later.

The housing 500 may be spaced apart from the body 10 without coming into contact with the body 10. For instance, the housing 500 may not be placed in a portion in which a display screen is displayed. Accordingly, a user can focus his or her attention on a display screen.

As an example, as shown in FIG. 4(*a*), the housing 500 may be connected to the body 10 through a plurality of flat flex cables (FFC) 161. The FFCs 161 may include a plurality of signal connection terminal pins and one or more ground terminal pins in order to interconnect between the housing 500 and the body 10. The FFC 161 is advantageous in that it is cheaper than other cables.

As another example, as shown in FIG. 4(*b*), the housing 500 may be coupled to the body 10 through a single circular cable 163. This means that electrical signals transmitted through several FFCs 161 in FIG. 4(*a*) can be transmitted through the single circular cable 163. A user may feel that an external appearance of the display device is neater because the housing 500 and the body 10 are interconnected through the single circular cable 163.

As yet another example, as shown in FIG. 4(*c*), the housing 500 and the body 10 may wirelessly exchange electrical signals. In this case, a user may feel that the external appearance of the display device is more neat compared to the case where the housing 500 and the body 10 are connected through the FFCs 161 or the circular cable 163.

The body 10 and housing 500 of the display device according to an embodiment of the present invention may be spaced apart from each other. Accordingly, a user can focus his or her attention more on the display screen, and the display device having a thinner body 10 can be implemented.

Referring to FIGS. 5(*a*)-5(*b*), a display device according to an embodiment of the present invention may exchange electrical signals with the housing 500 through electric wiring 816 configured to penetrate a to-be-attached surface 700 to which the body 10 is attached. In this case, the source PCB of the body 10 may have one side connected to the electric wiring 816.

The electric wiring 816 may be inserted into a penetrated portion of the to-be-attached surface 700. The electric wiring 816 may have one side connected to the source PCB and the other side connected to the circular cable 163. The electric wiring 816 may not be noticed by a user because it is placed within the to-be-attached surface 700.

In the display device according to an embodiment of the present invention, the body 10 and the housing 500 may be connected through the electric wiring 816 inserted into the to-be-attached surface 700. Accordingly, the user may feel that the housing 500 and the body 10 are not directly connected. Accordingly, the user may feel that the external appearance of the display device is more neat and is able focus his or her attention on a display screen without distraction.

Referring to FIGS. 6(*a*)-6(*c*), in a display device according to various embodiments of the present invention, a space in which the source PCB 172 may be placed may be required in the body 10.

As an example, as shown in FIG. 6(*a*), a portion that belongs to the back cover 200 and in which the source PCB 172 may be placed may be inwardedly depressed. The portion of the back cover 200 corresponding to the source PCB 172 may become thinner. The entire stiffness of the back cover 200 can be improved because the back cover 200 does not have a uniform thickness.

Since the portion of the back cover 200 corresponding to the portion in which the source PCB 172 is placed has a thinner thickness, the source PCB 172 can be placed in the back surface of the display panel 100 regardless of the thickness of the adhesive sheet 350.

As another example, as shown in FIG. 6(*b*), the portion of the back cover 200 in which the source PCB 172 may be placed may have the same thickness as other portions of the back cover 200. This means that there is no depressed portion in the back cover 200. In this case, a thickness of the adhesive sheet 350 between the display panel 100 and the back cover 200 in the third direction should be thicker than a thickness of the source PCB 172 in the third direction.

A process for manufacturing the back cover 200 can be simplified and a cost can be reduced because the portion of the back cover 200 corresponding to the portion in which the source PCB 172 is placed has the same thickness.

As shown in FIG. 6(c), the source PCB 172 may transmit an electrical signal to the housing 500 through the flat flex cable (FFC) 161. The FFC 161 may be connected to a side of the source PCB 172 opposite to a side connected to the source COF 123. The FFC 161 may include a plurality of signal connection terminal pins and one or more ground terminal pins in order to connect the source PCB 172 with the housing 500. The FFC 161 is advantageous in that it is cheap compared to other cables.

The source PCB 172 of the display device according to an embodiment of the present invention may be placed in the space between the display panel 100 and the back cover 200. Accordingly, a through hole or a hole may not be required for the back cover 200. Accordingly, a crack is prevented in the back cover 200, and stiffness of the back cover 200 can be improved.

In embodiments to be described later, structures related to the source PCB 172 are omitted for convenience of description. The structure related to the source PCB 172 may also be applied to other embodiments.

Figure 7A:
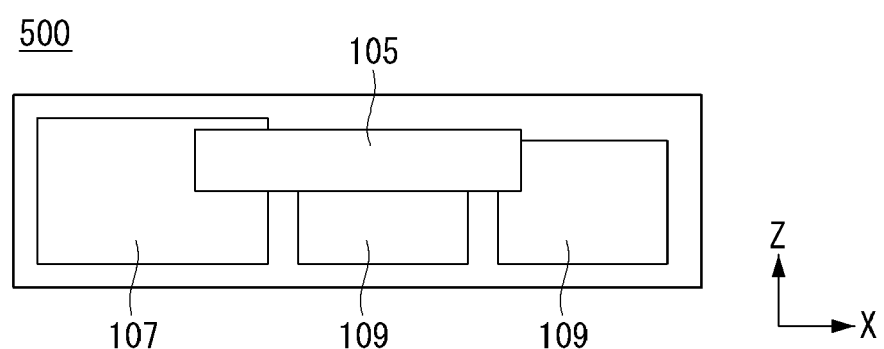
Figure 7A:
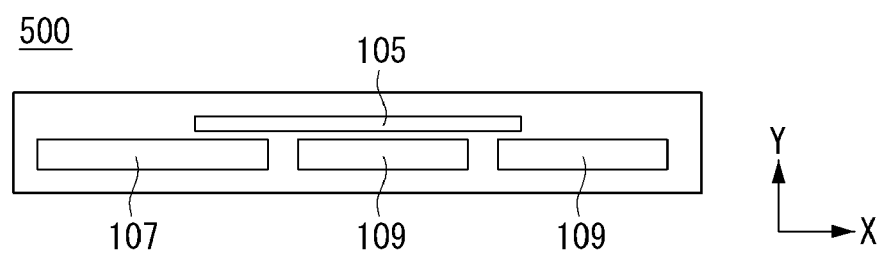
Figure 7B:
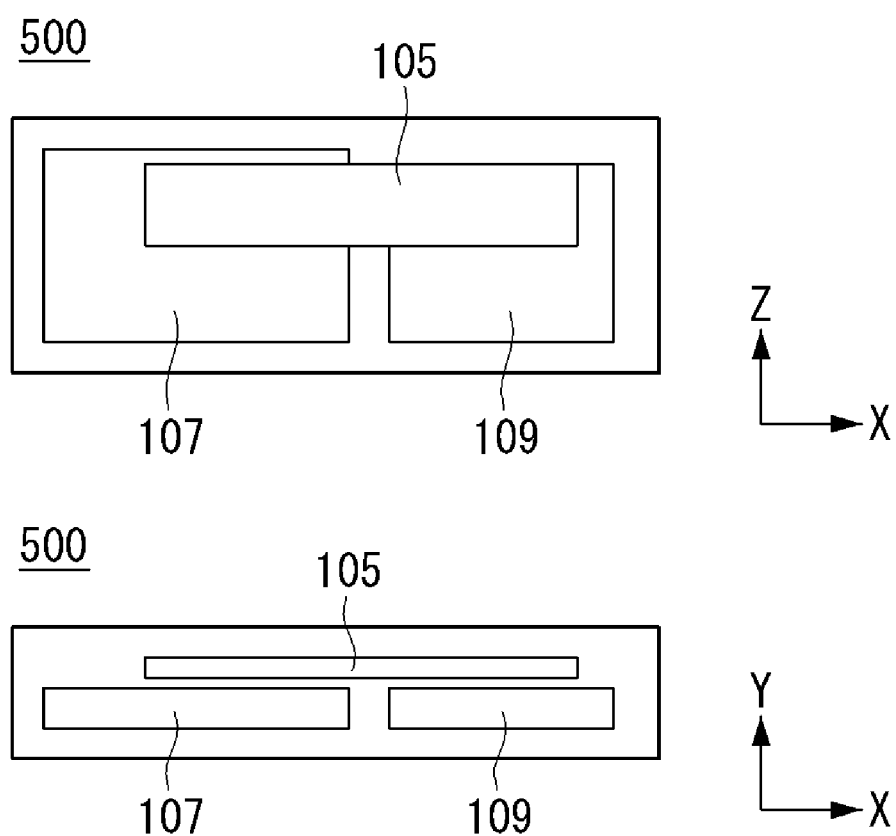

Referring to FIGS. 7(a)-7(b), one or more PCBs may be placed in the housing 500. The one or more PCBs may be spaced apart from each other.

As an example, the one or more PCBs may include a main board 109. The main board 109 may provide an interface for activating the display device. Furthermore, the operating state of each of the parts of the display device may be checked, may be managed, and may become an optimal state through the main board 109.

As another example, the one or more PCBs may include a power supply 107. The power supply 107 may supply power to the display device. That is, the power supply 107 may supply power to the body. The power supply 107 may convert an AC voltage into a DC voltage. The power supply 107 may convert a low frequency into a high frequency so that electrical efficiency is improved.

As yet another example, the one or more PCBs may include a timing controller board 105. The timing controller board 105 may transmit an input signal to the display panel 10. That is, the timing controller board 105 may transmit timing signals CLK, LOAD, and SPi for controlling the source PCB and video signals R, G, and B to the source PCB. Furthermore, the timing controller board 105 may control an image. The timing controller board 105 may be connected to the source PCB through one of the FFC, the circular cable, and wireless transmission.

As shown in FIG. 7(a), the main boards 109 may be spaced apart from each other from the central part of the housing 500 to the right side of the housing 500. The power supply 107 may be disposed on the left side facing the main board 109 on the central part of the housing 500 in the first direction, for example.

The timing controller board 105 may be placed on the upper side of the main boards 109 and the power supply 107. The internal space of the housing 500 can be reduced because the timing controller board 105 is placed on the upper side of the main board 109 and the power supply 107.

Although not shown, in order to block electromagnetic waves emitted from the power supply 107 and the main boards 109, a T-CON shield may be attached at the location on which the timing controller board 105 will be mounted. This means that the timing controller board 105 may be coupled to a surface of the T-CON shield rather than the power supply 107 and the main board 109. Accordingly, the power supply 107 and the main boards 109 and the timing controller board 105 will not interfere with each other. Furthermore, the T-CON shield can protect the timing controller board 105 from impact.

The timing controller board 105 may overlap with the power supply 107 and the main boards 109 in the height direction of the housing 500. Accordingly, the timing controller board 105 may be coupled to the power supply 107 and the main boards 109 more easily.

In an alternative embodiment, as shown in FIG. 7(b), a single main board 109 may be mounted on the inside of the housing 500. That is, the main board 109 may be placed on one side of the housing 500, and the power supply 107 may be disposed to face the main board 109 in the first direction.

In the display device according to an embodiment of the present invention, a space can be reduced because the timing controller board 105 is placed on the upper side of the power supply 107 and the main board 109. Accordingly, the user may feel less distracted by the housing 500 and the view of the display screen has been improved because a total size of the housing 500 is reduced.

Figure 8A:
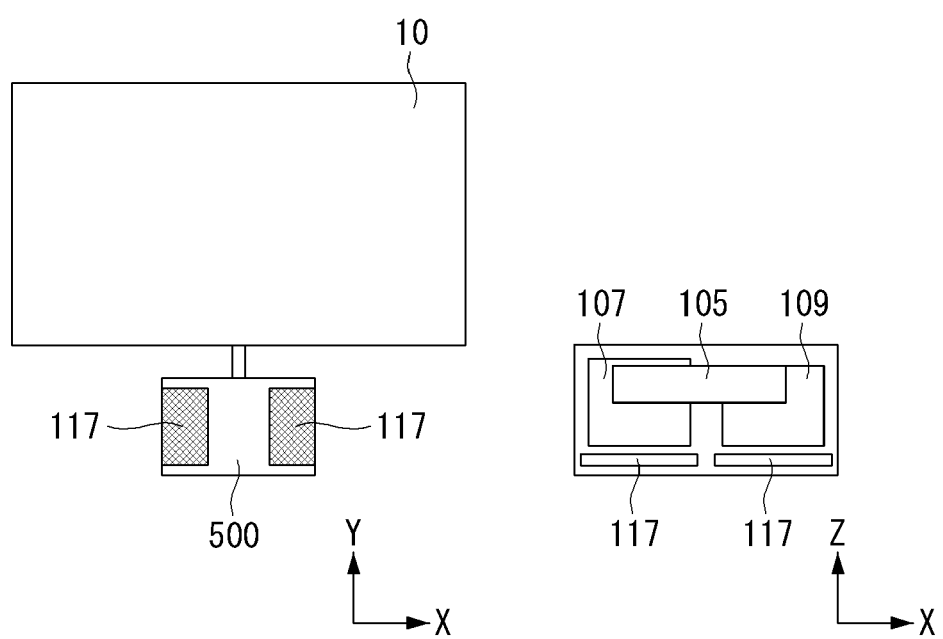
Figure 8B:
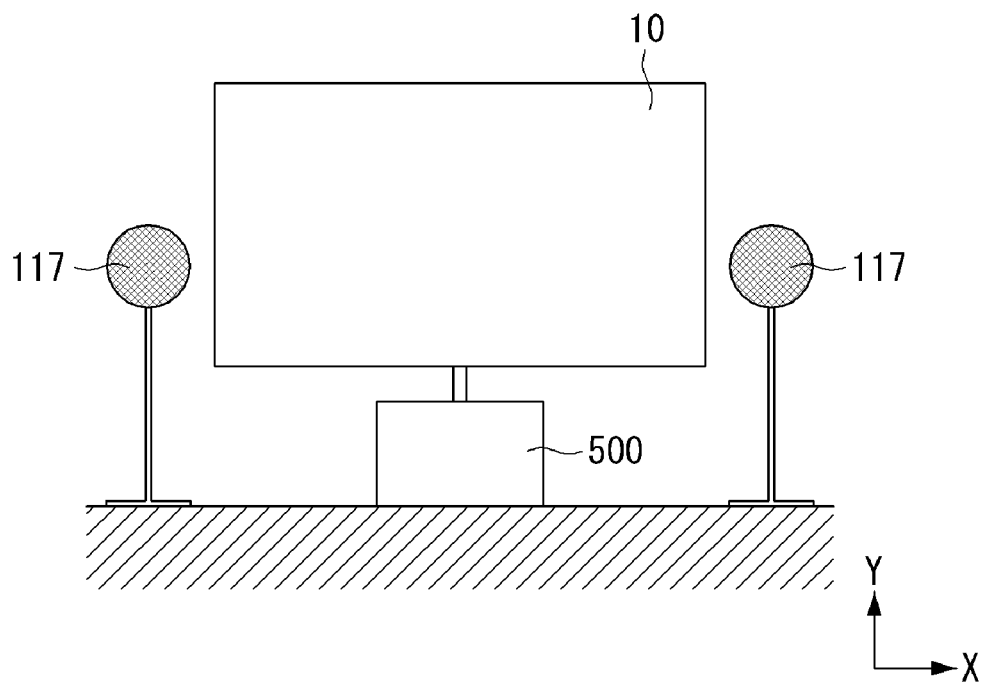

Referring to FIGS. 8(a)-8(b), in a display device according to various embodiments of the present invention, speakers 117 may be placed on either side of the housing 500 on the front thereof. The speakers 117 may generate sound to a user. Accordingly, it may be better when the speakers 117 are placed on the front surface of the housing 500.

As shown in FIG. 8(a), the speakers 117 may be spaced apart from one or more PCBs mounted on the inside of the housing 500 and may be mounted on the front part of the housing 500. In an alternative embodiment, as shown in FIG. 8(b), the speakers 117 may be spaced apart from each other and placed outside of the housing 500. A user may place the speakers 117 at the locations in which a sound can be better transferred to a user because the speakers 117 are placed outside of the housing 500. The speakers 117 may be placed on both sides of the body 10 of the display device as shown in FIG. 8(b).

As described above, in the display device according to various embodiments of the present invention, the speakers 117 may be placed on the front surface of the housing 500 or may be placed on both sides of the housing 500 outside of the housing 500. Accordingly, sound from the display device can be better delivered to a user.

FIGS. 9(a), 9(b), 9(c), 10(a), 10(b), 10(c), 11, 12(a), 12(b), 12(c), 13(a), 13(b), 13(c), 14(a), 14(b), 15(a), 15(b), 16(a), 16(b), 17(a), 17(b), 18(a), 18(b), 18(c), 19(a), and 19(b) are diagrams showing a display device according to various embodiments of the present invention.

Figure 9A:
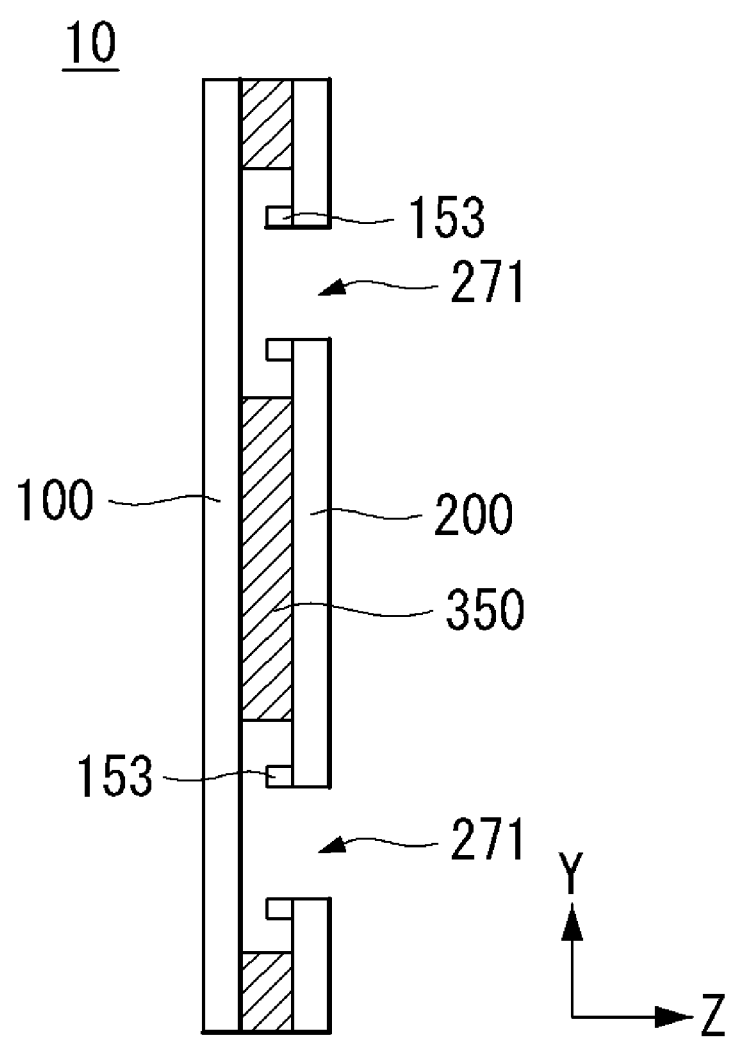
Figure 9C:
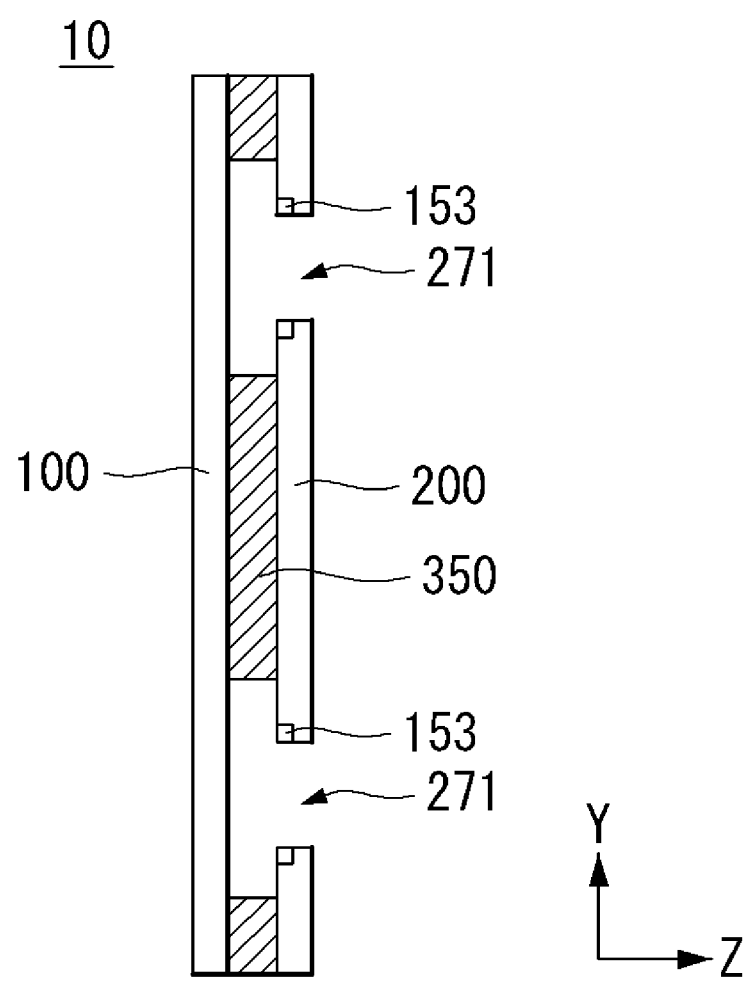

Referring to FIGS. 9(a)-9(c), in the display device according to an embodiment of the present invention, the bracket 153 may be attached to the boundary of the coupling hole 271 of the back cover 200 in various forms.

As an example, as shown in FIG. 9(a), the back cover 200 may have the same thickness in the surrounding area of the coupling hole 271 and other areas of the back cover 200. The bracket 153 may be attached to the front of the back cover 200. Accordingly, the bracket 153 may protrude from the front of the back cover 200 by a thickness in the third direction of the bracket 153. In this instance, the thickness of the adhesive sheet 350 may be greater than that of the bracket 153.

As another example, as shown in FIG. 9(b), the back cover 200 may have different thicknesses in the surrounding area of the coupling hole 271 than other areas of the back cover 200. For example, the thickness of the back cover 200 in the surrounding area of the coupling hole 271 may be thinner than that in the other areas of the back cover 200.

The bracket 153 may be attached to the surrounding area of the coupling hole 271 on the front surface of the back cover 200. The thickness of the bracket 153 in the third direction may be greater than a difference between the thicknesses of the surrounding area of the coupling hole 271 and other areas of the back cover 200. Accordingly, part of the bracket 153 may protrude from the front of the back cover 200. The thickness of protruding portion of the bracket 153 may be smaller than the overall thickness of the bracket 153. Accordingly, the thickness of the body 10 in the third direction can be further reduced.

As yet another example, as shown in FIG. 9(c), the back cover 200 may have different thicknesses in the surrounding area of the coupling hole 271 than other areas of the back cover 200. For example, the thickness of the back cover 200 in the surrounding area of the coupling hole 271 may be thinner than that in the other areas of the back cover 200.

The bracket 153 may be attached to the surrounding area of the coupling hole 271 on the front surface of the back cover 200. The thickness of the bracket 153 in the third direction may be the same as a difference between the thicknesses of the surrounding area of the coupling hole 271 and other areas of the back cover 200. In this case, the bracket 153 may not protrude from the back cover 200. Accordingly, the thickness of the body 10 can be further thinned. Furthermore, the bracket 153 can be attached to the back cover 200 more easily because the bracket 153 is configured to be inserted into the back cover 200.

Furthermore, since the bracket 153 is not protruding, there is no obstacle in the space between the display panel 100 and the back cover 200. Accordingly, a hook to be described later can couple to the back cover 200 more easily.

Figure 10A:
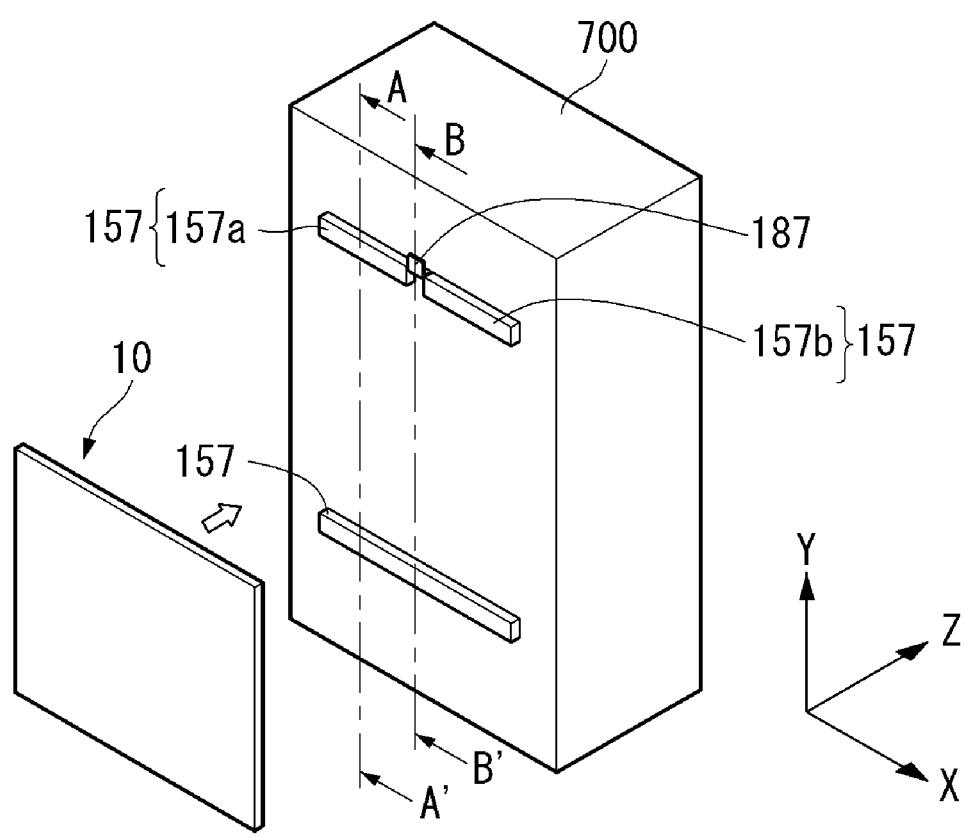
Figure 10B:
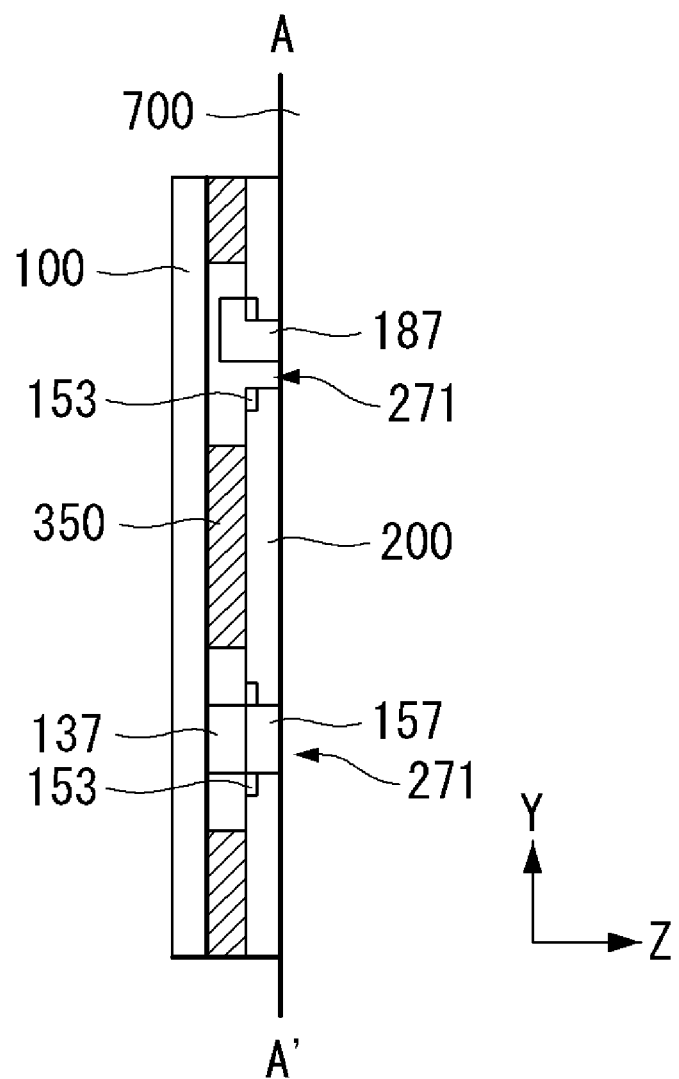
Figure 10C:
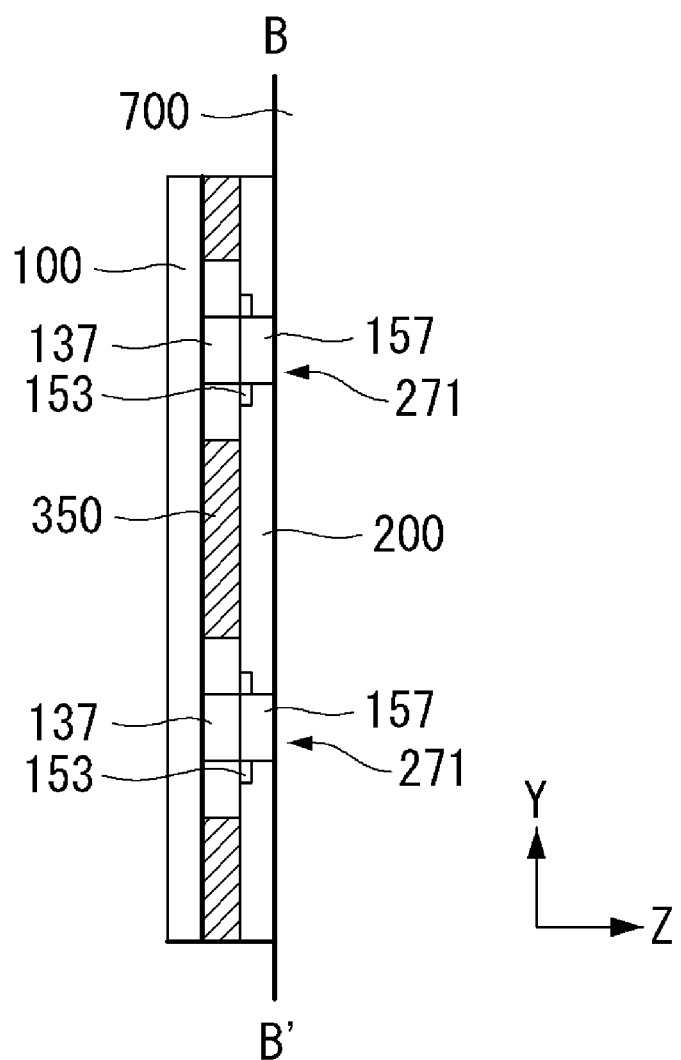

Referring to FIGS. 10(a), 10(b) and 10(c), in a display device according to an embodiment of the present invention, the body 10 may be coupled to the to-be-attached surface 700. The body 10 may have one of a first state in which the body is coupled to the to-be-attached surface 700 and a second state in which the body is separated from the to-be-attached surface 700. An attachment unit may attach the body 10 to the to-be-attached surface 700. The attachment unit may include a hook 187 to be described later and a second coupling unit 157. The hook 187 and second coupling unit 157 of the attachment unit may be formed in various ways. For example, the hook 187 may be attached to the first area of the to-be-attached surface 700, and the second coupling unit 157 may be attached to the second area of the to-be-attached surface 700.

As shown in FIG. 10(a), a first portion of the second coupling unit 157 and the hook 187 may be attached to the upper side of the to-be-attached surface 700, and a second portion of the second coupling unit 157 may be attached to the lower side of the to-be-attached surface 700.

The second coupling unit 157 or the hook 187 placed on the upper side and lower side of the to-be-attached surface 700 may be placed in portions corresponding to the coupling holes 271 of the body 10 in the first state. The hook 187 may be placed on the upper side of the to-be-attached surface 700 in the central part thereof, and the first portion of the second coupling unit 157 may be placed on both sides of the hook 187. That is, the first portion of the second coupling unit 157 may include a one-side coupling unit 157a placed on one side of the hook 187 and an other-side coupling unit 157b placed on the other side of the hook 187 which faces the one-side coupling unit 157a thereof. The hook 187 and the one-side and the other-side coupling units 157a and 157b may be spaced apart from each other.

As shown in FIG. 10(b), the hook 187 may be inserted into the coupling hole 271 placed on the upper side of the back cover 200 in the first state. The hook 187 may come into contact with the bracket 153 on the upper side of the coupling hole 271. The bracket 153 may prevent a crack from being formed in the back cover 200 in the surroundings of the coupling hole 271. Accordingly, the bracket 153 can reinforce the stiffness of the surroundings of the coupling hole 271.

As shown in FIG. 10(c), in the back cover 200 in the first state, the first coupling unit 137 and the second coupling unit 157 may be attached to each other. In this case, the first coupling unit 137 and the second coupling unit 157 may be magnets having different polarities. The second coupling unit 157 may be inserted into the coupling hole 271 to attach to the first coupling unit 137. Accordingly, the second coupling unit 157 may engage with the coupling hole 271 along with the hook 187 in addition to coupling with the first coupling unit 137 by magnetism. However, the present invention is not limited thereto. For example, the first coupling unit 137 and the second coupling unit may be adhesive sheets or Velcro.

In a display device according to an embodiment of the present invention, the hook 187 may support the body 10. Accordingly, a coupling force between the body 10 and the to-be-attached surface 700 can be supplemented when they are coupled by the second coupling unit 157.

Figure 11:
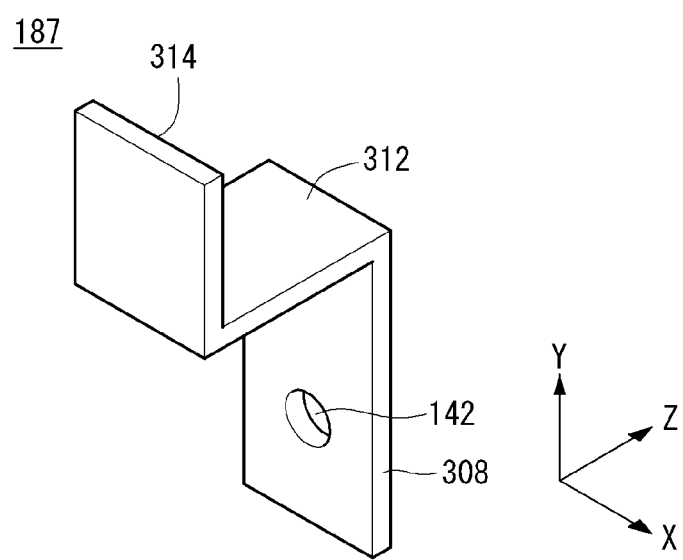

Referring to FIG. 11, the hook 187 may include a coupling portion 308, a first portion 312, and a second portion 314.

The coupling portion 308 may be a portion attached to a to-be-attached surface. The coupling portion 308 may be downwardly extended. The coupling portion 308 may be coupled to the to-be-attached surface using a screw through at least one hole 142, but the present invention is not limited thereto. For example, the coupling portion 308 may be coupled to the to-be-attached surface using adhesives or Velcro. If the coupling portion 308 is coupled to the to-be-attached surface using adhesives or Velcro, the at least one hole 142 need not be placed in the coupling portion 308. Accordingly, an external appearance of the hook 187 may become neater.

The first portion 312 may extend in a direction orthogonal to the coupling portion 308. For example, if the coupling portion 308 is extended in parallel to the to-be-attached surface, the first portion 312 may extend orthogonal to the front of the to-be-attached surface.

The first portion 312 may be a portion on which the body is placed in the first state. That is, the first portion 312 is a portion on which the coupling hole of the body is placed in the first state. The first portion 312 may fix the body so that the body does not move up and down.

The second portion 314 may extend in an upwardly direction orthogonal to the first portion 312. The second portion 314 may extend in an opposite direction in parallel to the coupling portion 308 with respect to the first portion 312. For example, the second portion 314 may extend in an upwardly direction in parallel to the to-be-attached surface.

The second portion 314 may be a portion coming into contact with the bracket 153 in the first state. The second portion 314 may fix the body so that the body does not forwardly incline away from the to-be-attached surface in the first state.

The hook 187 may fix the body so that the body does not move in the top and down directions and incline in front and rear directions. Accordingly, the body is more securely attached to the to-be-attached surface.

Figure 12A:
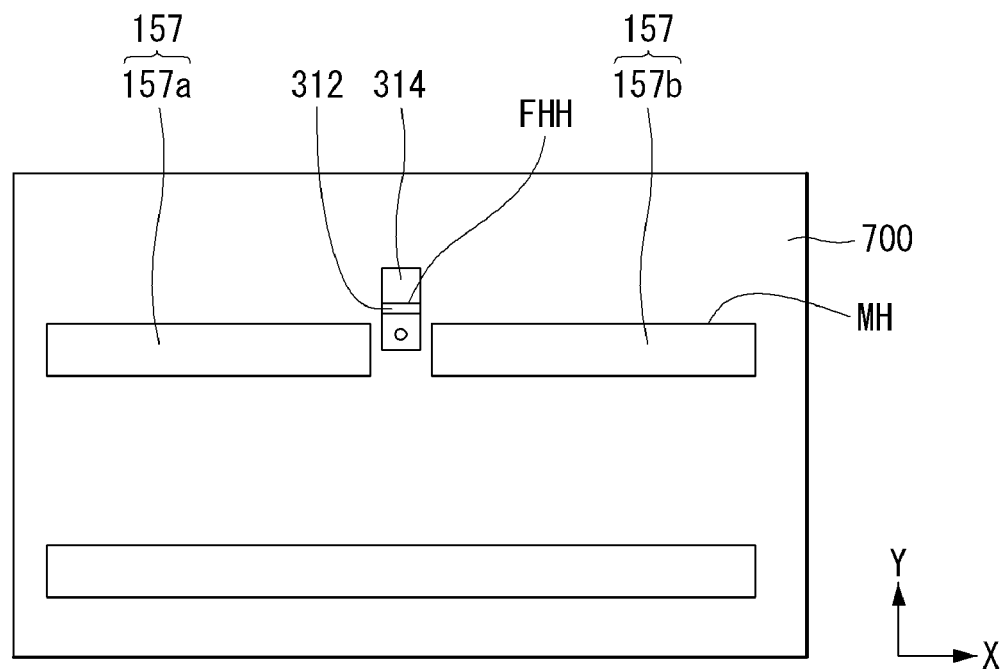
Figure 12B:
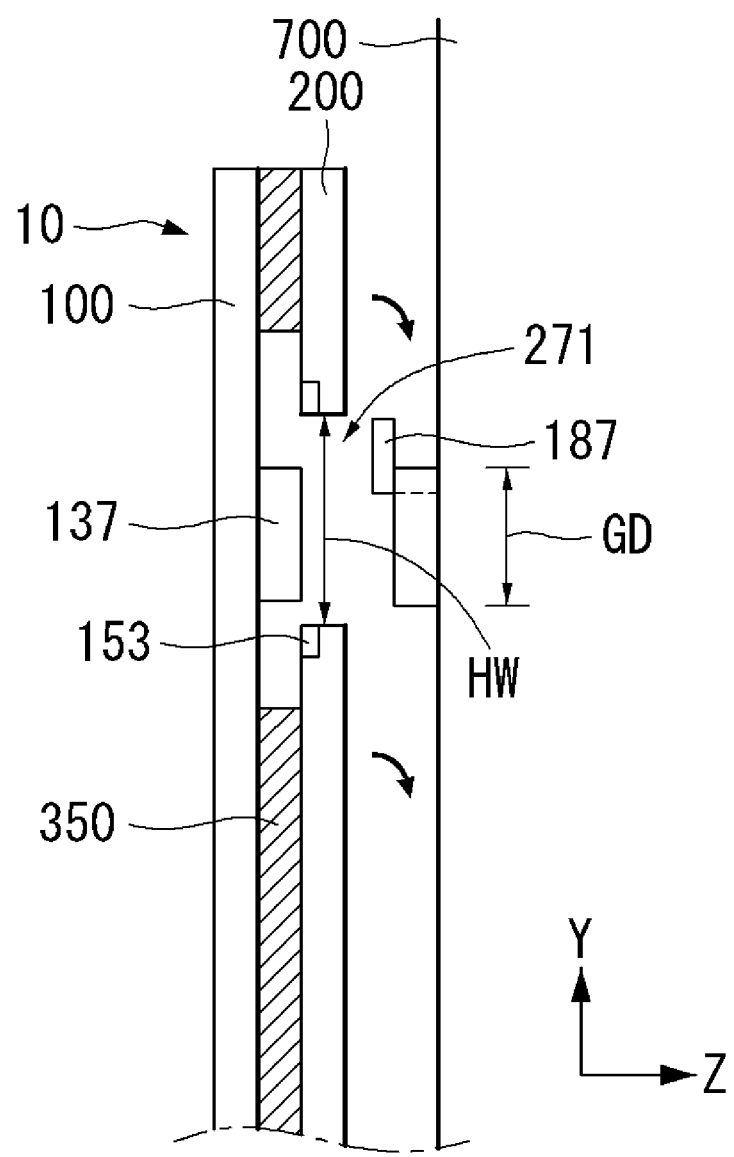
Figure 12C:
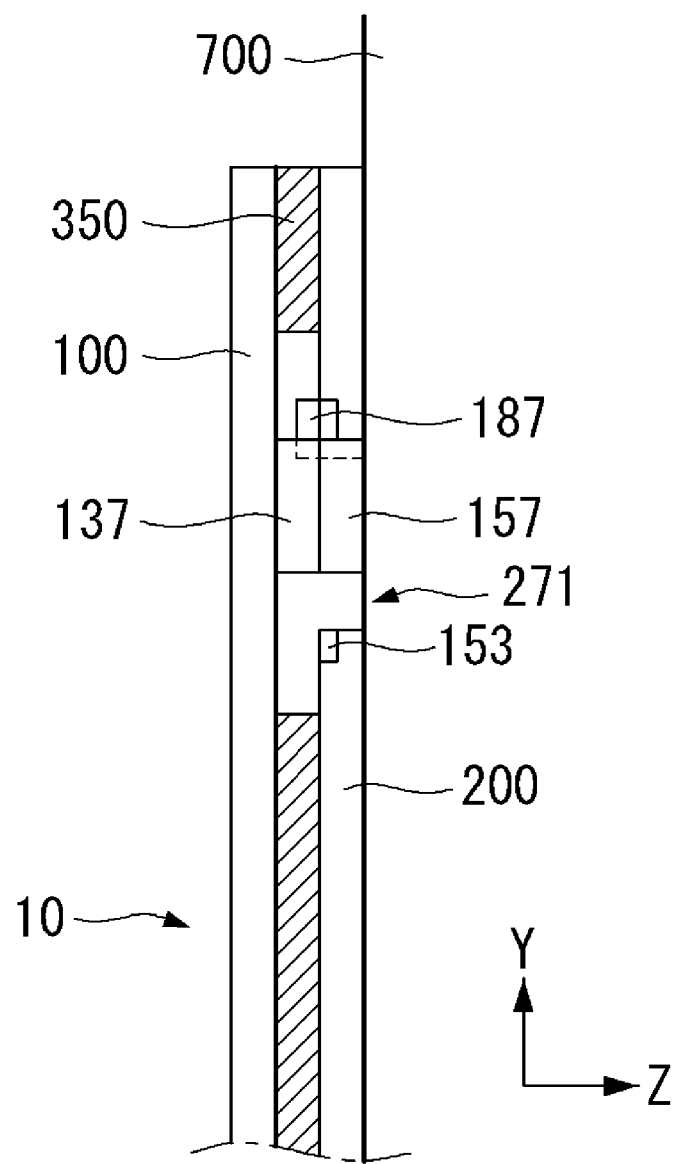

Referring to FIGS. 12(a), 12(b), and 12(c), as shown in FIG. 12(a), the height MH of a top surface of the first portion of the second coupling unit 157 may be the same as or lower than the height FHH of a top surface of the first portion 312 of the hook 187.

If the height MH of the top surface of the first portion of the second coupling unit 157 is higher than the height FHH of the top surface of the first portion 312 of the hook 187, the back cover 200 may not come into contact with the second portion 312 in the first state. Accordingly, the body 10 may not be fixed by the hook 187.

If the height MH of the top surface of the first portion of the second coupling unit 157 is the same as or lower than the height FHH of the top surface of the first portion 312 of the hook 187, the body 10 may be fixed by the hook 187 so that it does not move. Accordingly, the body is more securely attached to the to-be-attached surface.

As shown in FIG. 12(b), a length GD from the upper side of first portion 312 of the hook 187 to the lower side of the first portion of the second coupling unit 157 may be smaller than the width HW of the coupling hole 271 in the second direction. That is, the length GD of a portion coupling the body 10 to the to-be-attached surface 700 is smaller than the width HW of the coupling hole 271 in the second direction.

If the length GD of the portion coupling the body 10 to the to-be-attached surface 700 is greater than the width HW of the coupling hole 271 in the second direction, it may be difficult for the hook 187 and the first portion of the second coupling unit 157 to be inserted into the coupling hole 271, as shown in FIG. 12(c). Accordingly, the body 10 may not couple to the to-be-attached surface 700.

Figure 13A:
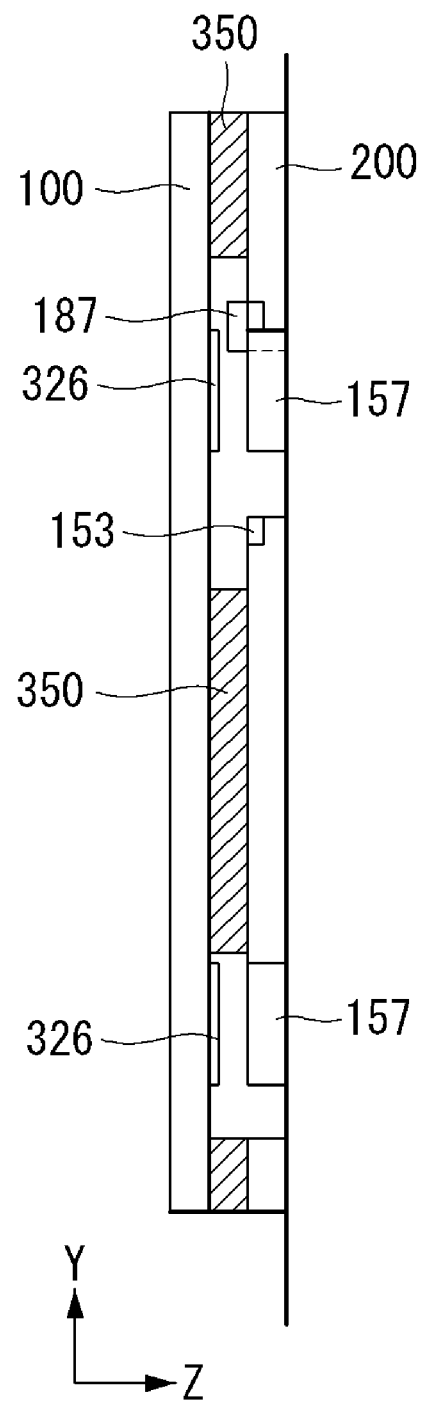
Figure 13B:
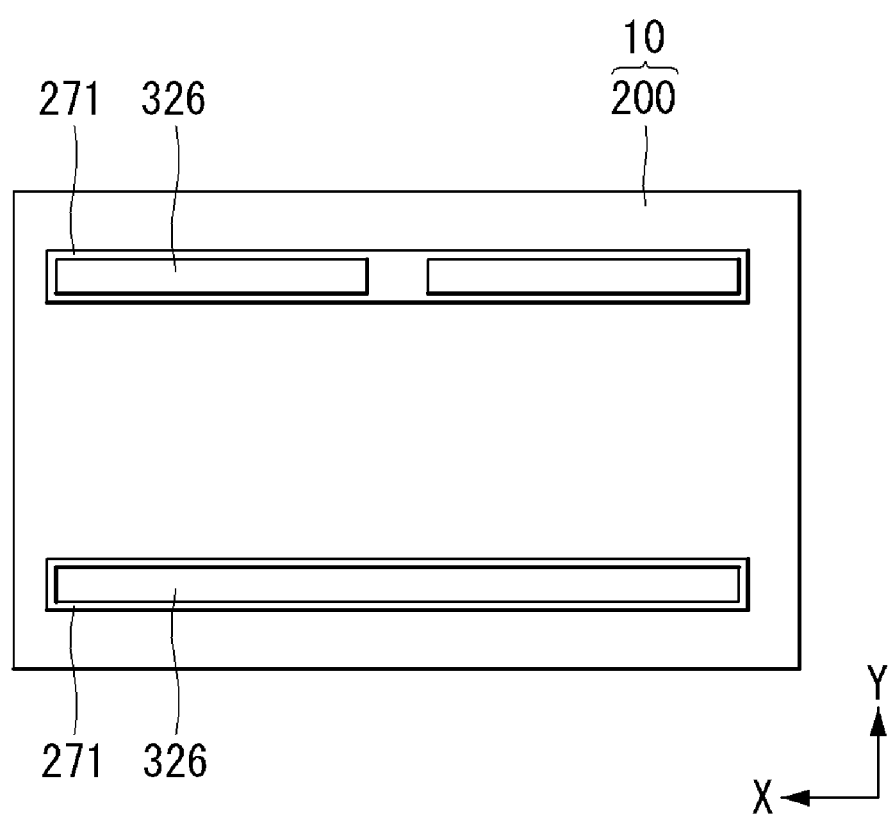
Figure 13C:
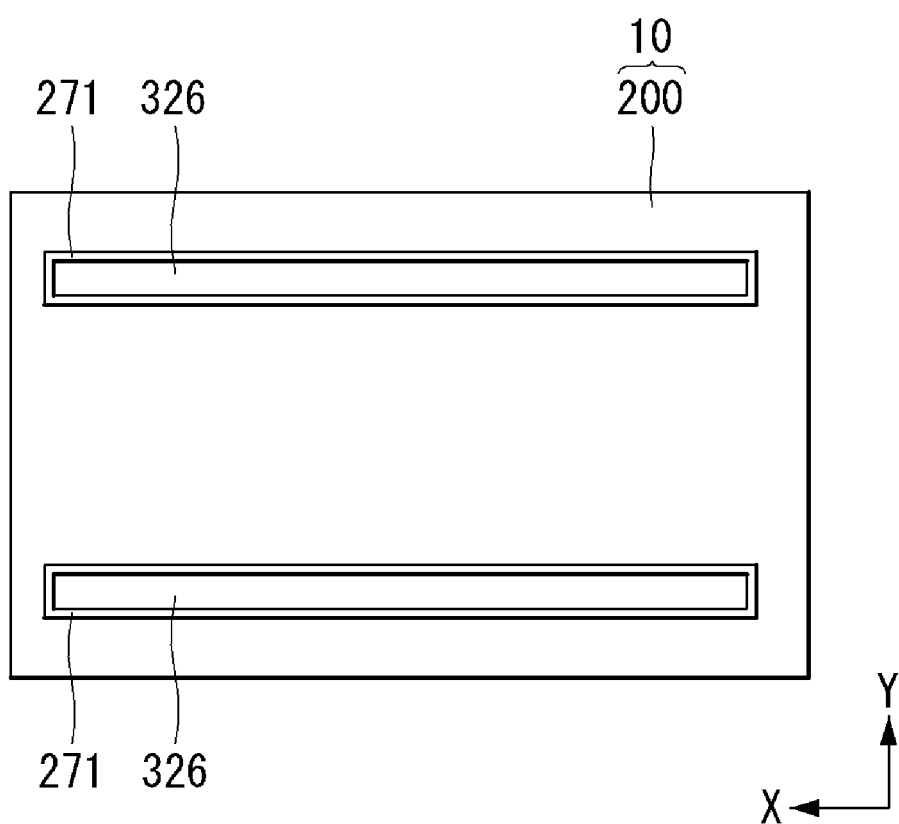

Referring to FIGS. 13(a), 13(b), and 13(c), a display device according to an embodiment of the present invention may not include the first coupling unit.

A metal layer 326 may be attached to the back surface of the display panel 100 instead of the first coupling unit. The metal layer 326 may include a metal material. Accordingly, the second coupling unit 157 may be inserted into the coupling hole 271 in the first state and may couple to the metal layer 326 by magnetic force. That is, the second coupling unit 157 may couple to the metal layer 326 through the coupling hole 271 in the first state. As shown in FIG. 13(b), the metal layer 326 may be placed in a portion corresponding to the second coupling unit 157 in the first state in order to be coupled to the second coupling unit 157 by magnetism. The metal layer 326 may be placed in the portion corresponding to the coupling hole 271 other than the central part of the coupling hole 271 on the upper side.

The metal layer 326 may have a very thin thickness in the third direction. Accordingly, the display device can have light weight. Furthermore, since the metal layer 326 has a thin thickness, it may also be placed in a portion corresponding to the hook 187 in the first state, as shown in FIG. 13(c). The metal layer 326 does not come into contact with the hook 187 and the second coupling unit 157 in the first state.

In a display device according to an embodiment of the present invention, the metal layer 326 may be placed in the back surface of the display panel. Accordingly, weight of the display device can be reduced. Furthermore, the display device may have a thin thickness because the thickness of the metal layer 326 is thin.

Figure 14A:
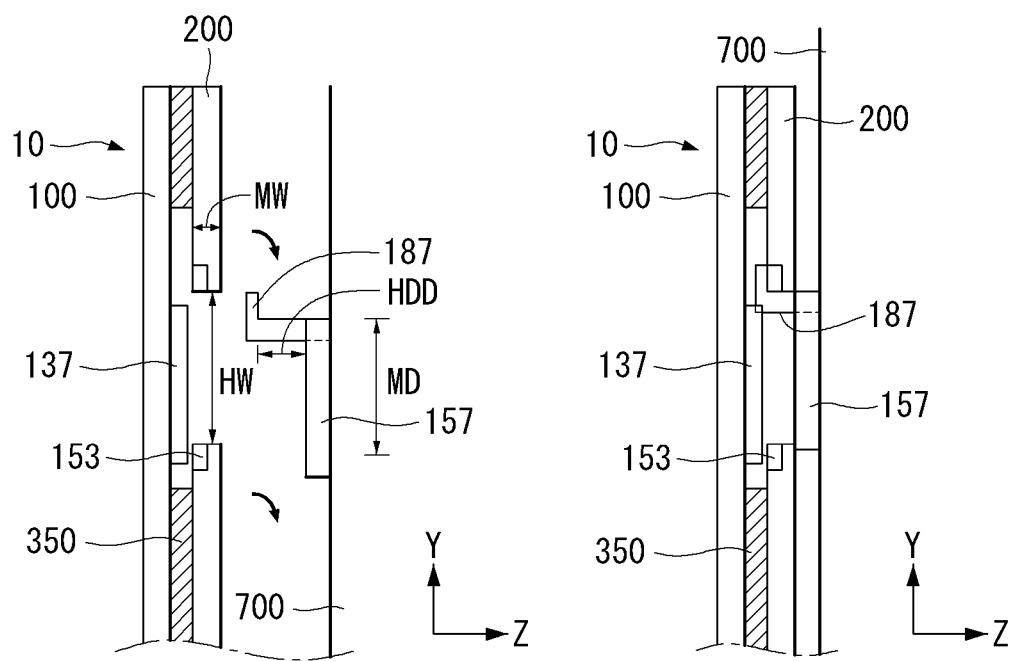
Figure 14B:
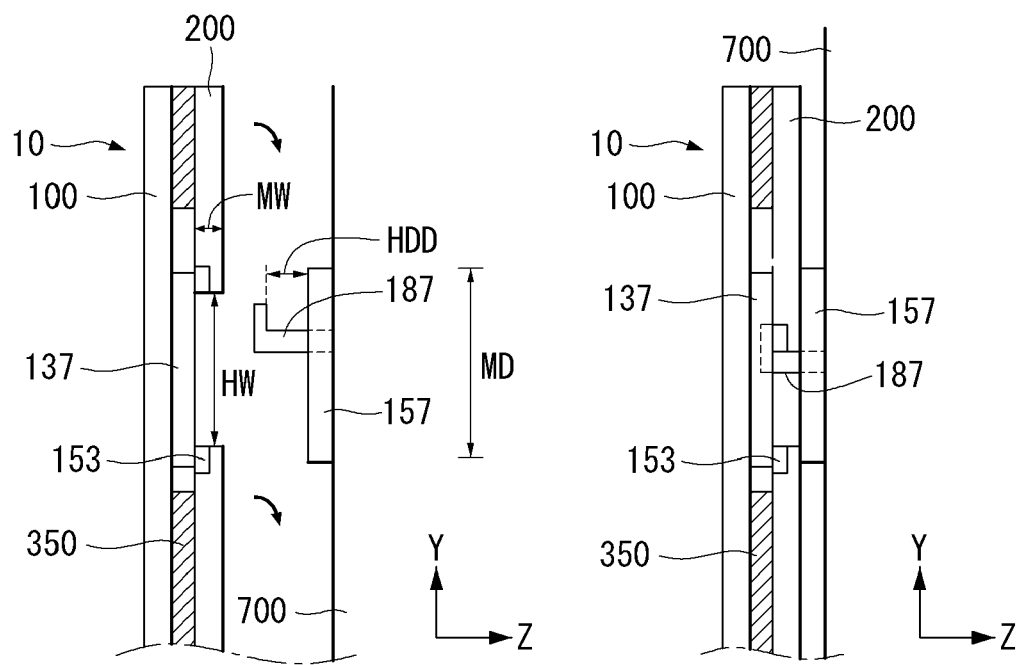

Referring to FIGS. 14(a) and 14(b), in the display device according to an embodiment of the present invention, the length MD of the second coupling unit 157 in the second direction may be greater than the width HW of the coupling hole 271 in the second direction. In this case, the second coupling unit 157 may not be inserted into the coupling hole 271.

A distance HDD from the front of the second coupling unit 157 to the second portion of the hook 187 may be greater than the width MW of the back cover 200 so that the hook 187 can be inserted into the coupling hole 271.

In the present embodiment, the second coupling unit 157 may be spaced apart from the first coupling unit 137 in the first state. The second coupling unit 157 and the first coupling unit 137 may be attracted to each other by magnetism even though they are spaced apart.

As shown in FIG. 14(a), the second coupling unit 157 may protrude only downward without upwardly protruding from the hook 187. In this case, when the hook 187 is coupled to the body 10, the upper side of the hook 187 may be further inserted into the inside of the coupling hole 271. Accordingly, the hook 187 can be inserted into the coupling hole 271 more easily.

In an alternative embodiment, as shown in FIG. 14(b), the second coupling unit 157 may protrude upwardly and downwardly from the hook 187. In this case, in the first state, both the upper and lower parts of the second coupling unit 157 may come into contact with the back cover 157. Accordingly, the body 10 may not incline forwardly due to the hook 187 and may not incline backwardly due to the second coupling unit 157. Accordingly, the body 10 can be fixed to the to-be-attached surface 700 more strongly.

In the display device according to an embodiment of the present invention, while the length MD of the second coupling unit 157 in the second direction may be greater than the width HW of the coupling hole 271 in the second direction, the body 10 can be fixed to the to-be-attached surface 700 strongly.

Figure 15A:
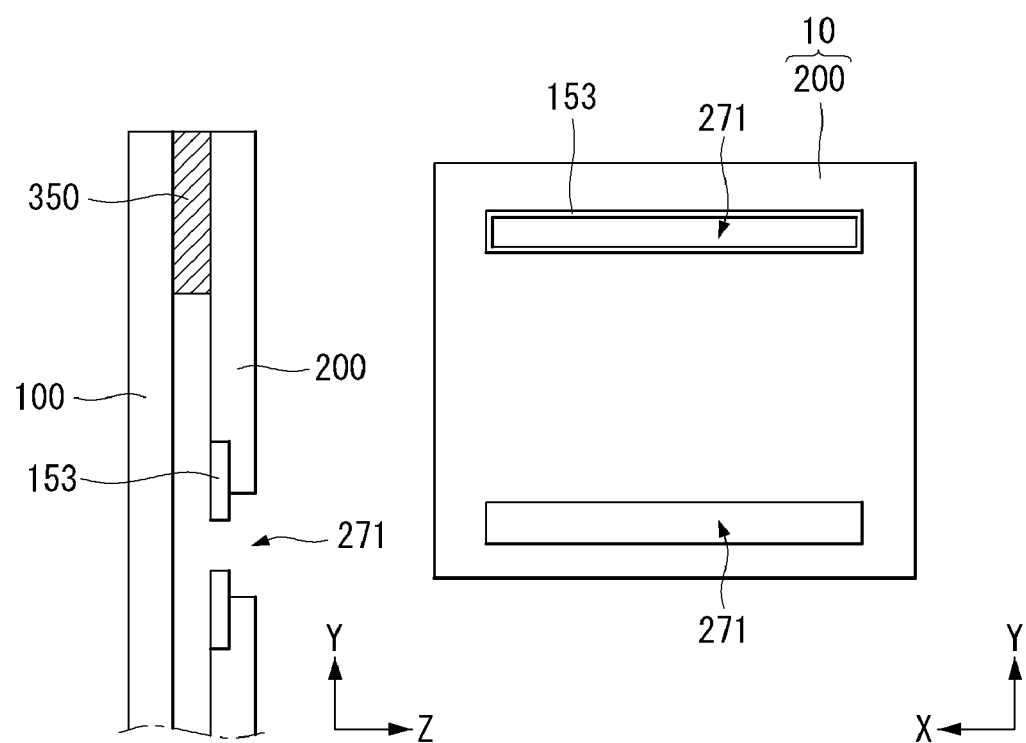

Referring to FIGS. 15(a) and 15(b), in a display device according to an embodiment of the present invention, the bracket 153 placed on the upper side of the back cover 200 may protrude from the back cover 200 in the second direction. Accordingly, at least part of the bracket 153 may be exposed through the coupling hole 271 in the rear of the body 10.

As shown in FIG. 15(b), the hook 187 may come into contact with the protruded portion of the bracket 153 in the first state. The hook 187 does not come into contact with the back cover 200. A possibility that a crack or damage may occur in the back cover 200 may be minimal because the hook 187 comes into contact with only the bracket 153 having excellent strength and stiffness in the first state.

The bracket 153 within the coupling hole 271 placed on the lower side of the back cover 200 may not protrude in the second direction because the bracket 153 is not engaged with the hook 187, but the present invention is not limited thereto. For example, the bracket 153 placed on the lower side of the back cover 200 may also protrude from the back cover 200 in the second direction.

Figure 16A:
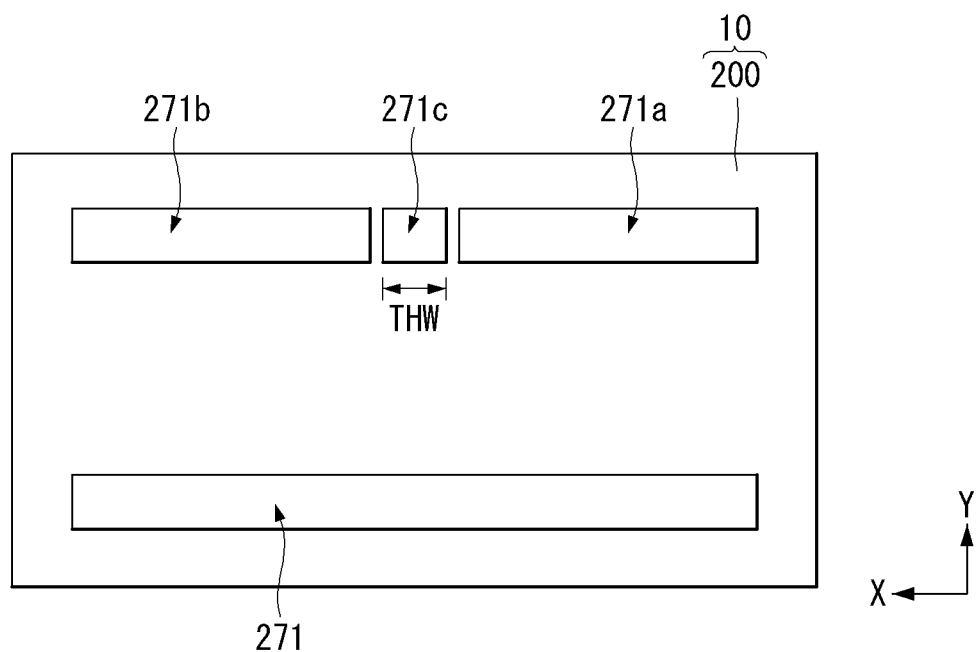
Figure 16B:
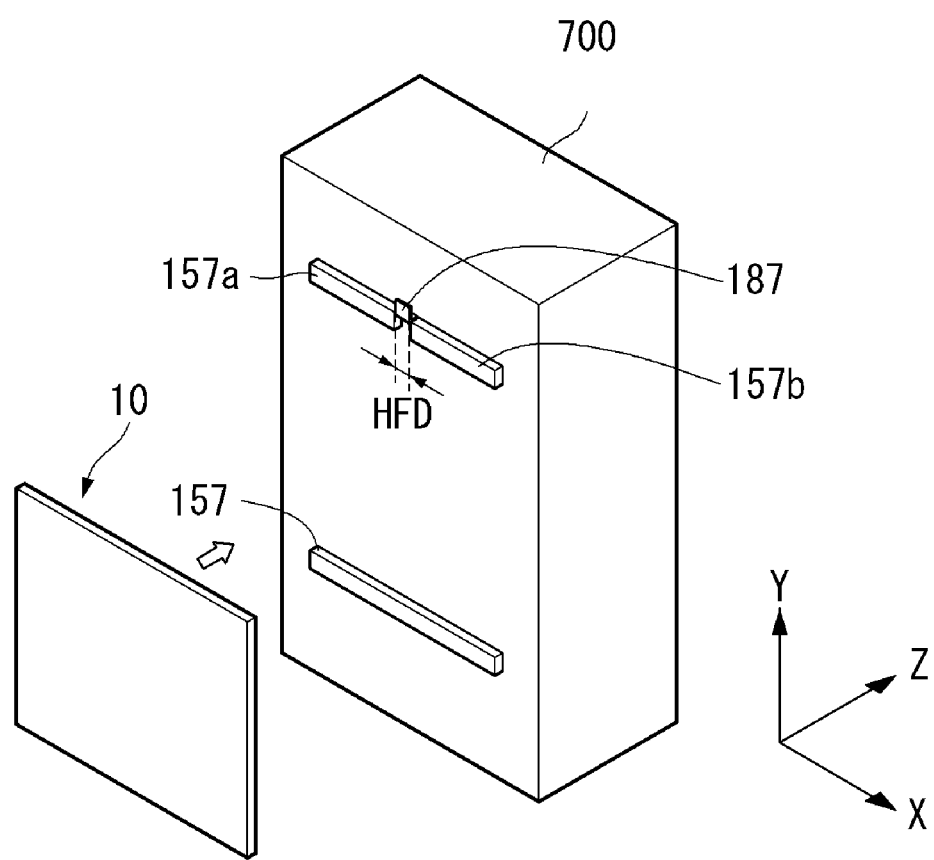

Referring to FIGS. 16(a) and 16(b), in a display device according to an embodiment of the present invention, the coupling hole 271 placed on the upper side of the back cover 200 may be divided into first to third coupling holes 271a, 271b, and 271c.

The first and the second coupling holes 271a and 271b may be placed on either side of the third coupling hole 271c. The first and the second coupling holes 271a and 271b may be portions into or to which the one-side and other-side coupling units 157a and 157b are inserted or closely attached in the first state. This means that the one-side and other-side coupling units 271a and 271b are placed in portions corresponding to the one-side and other-side coupling units 157a and 157b in the first state.

The third coupling hole 271c may be placed in the upper central part of the back cover 200. The third coupling hole 271c may be a portion into which the hook 187 is inserted in the first state. The width THW of the third coupling hole 271c in the second direction may be the same as or greater than the width HFD of the hook 187 in the second direction.

In a display device according to an embodiment of the present invention, the third coupling hole 271c to which the hook 187 is coupled may be separated from other coupling holes. Accordingly, the third coupling hole 271c may provide guidance of a coupling location when the body 10 is coupled to the hook 187. Furthermore, the body 10 may not shift left and right because the hook 187 is engaged with the sides of the third coupling hole 271c.

Figure 17A:
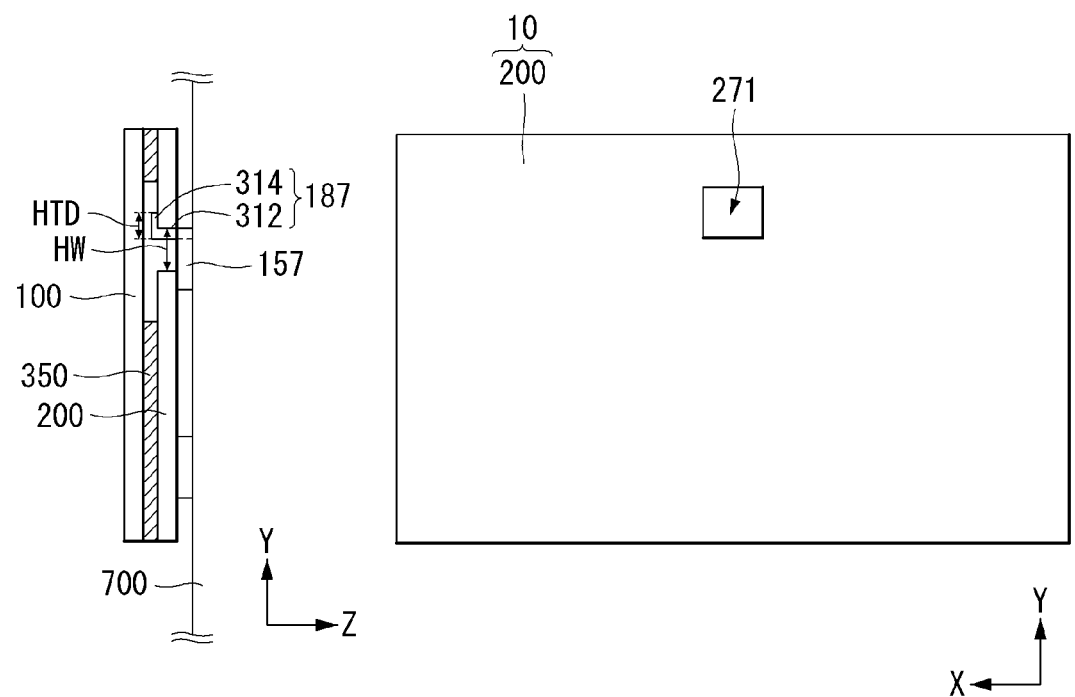
Figure 17B:
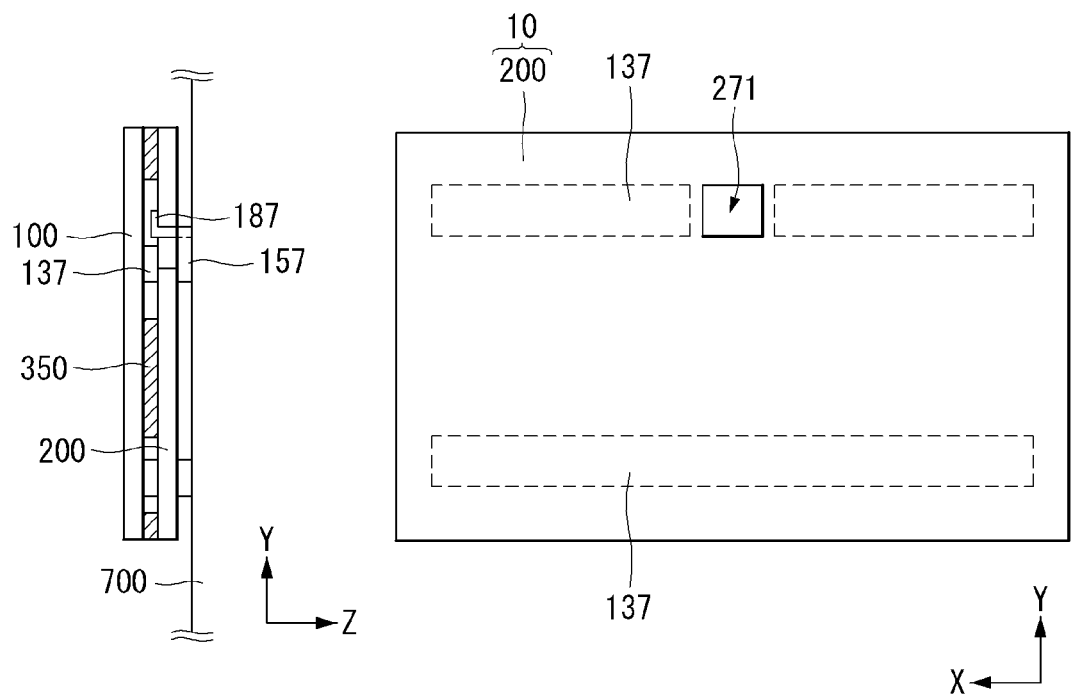

Referring to FIGS. 17(a) and 17(b), as shown in FIG. 17(a), the first coupling unit may not be placed in the body 10. The second coupling unit 157 may be coupled to the back cover 200 by magnetic force. Accordingly, the second coupling unit 157 may not be inserted into the coupling hole 271 of the back cover 200.

Since only the hook 187 has to be inserted into the coupling hole 271, the width HW of the coupling hole 271 in the second direction may be greater than the height HTD of the second portion 314 of the hook 187. Accordingly, the width HW of the coupling hole 271 in the second direction may be very small. A probability in which a crack or damage may occur in the back cover 200 may be minimal because the width HW of the coupling hole 271 is small.

As shown in FIG. 17(b), the coupling hole 271 of the back cover 200 may be placed in only a portion corresponding to the hook 187 in the first state. The first coupling unit 137 is shielded by the back cover 200. In this case, the first coupling unit 137 and the second coupling unit 157 may be spaced apart from each other with the back cover 200 interposed therebetween in the first state. The first coupling unit 137 and the second coupling unit 157 may be attracted to each other by magnetism even though they are spaced apart with each other.

In the display device according to an embodiment of the present invention, the first coupling unit 137 may be shielded by the back cover 200. Accordingly, when viewing the body 10 from the back, a user may feel that an external appearance is neat, while the body 10 and the to-be-attached surface 700 can be coupled more strongly by the first coupling unit 137.

Figure 18A:
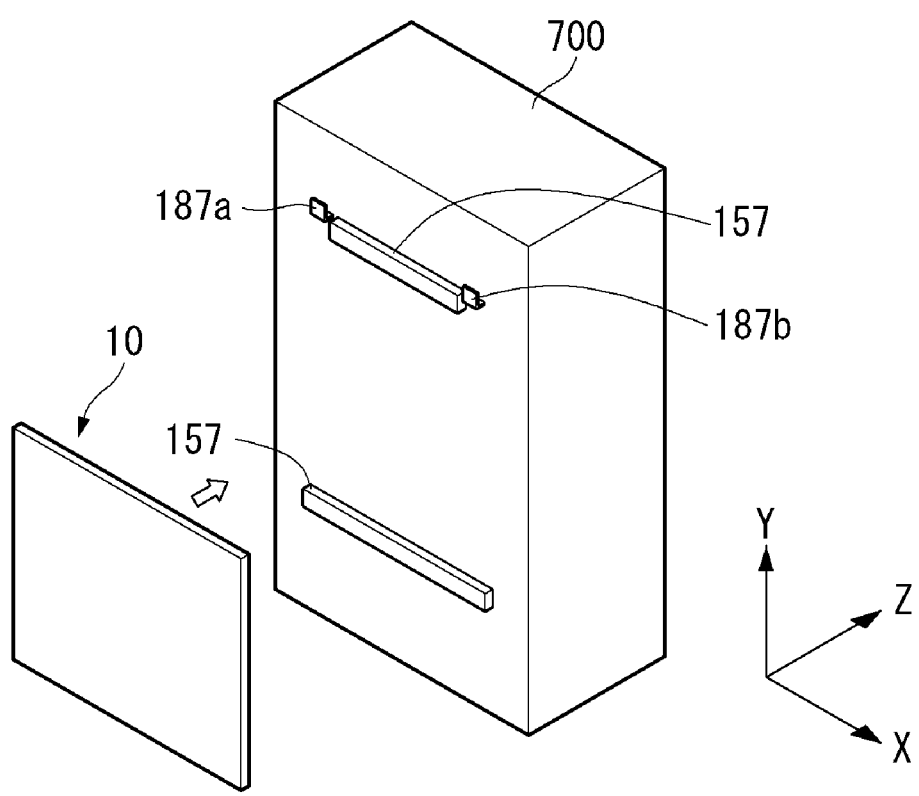
Figure 18B:
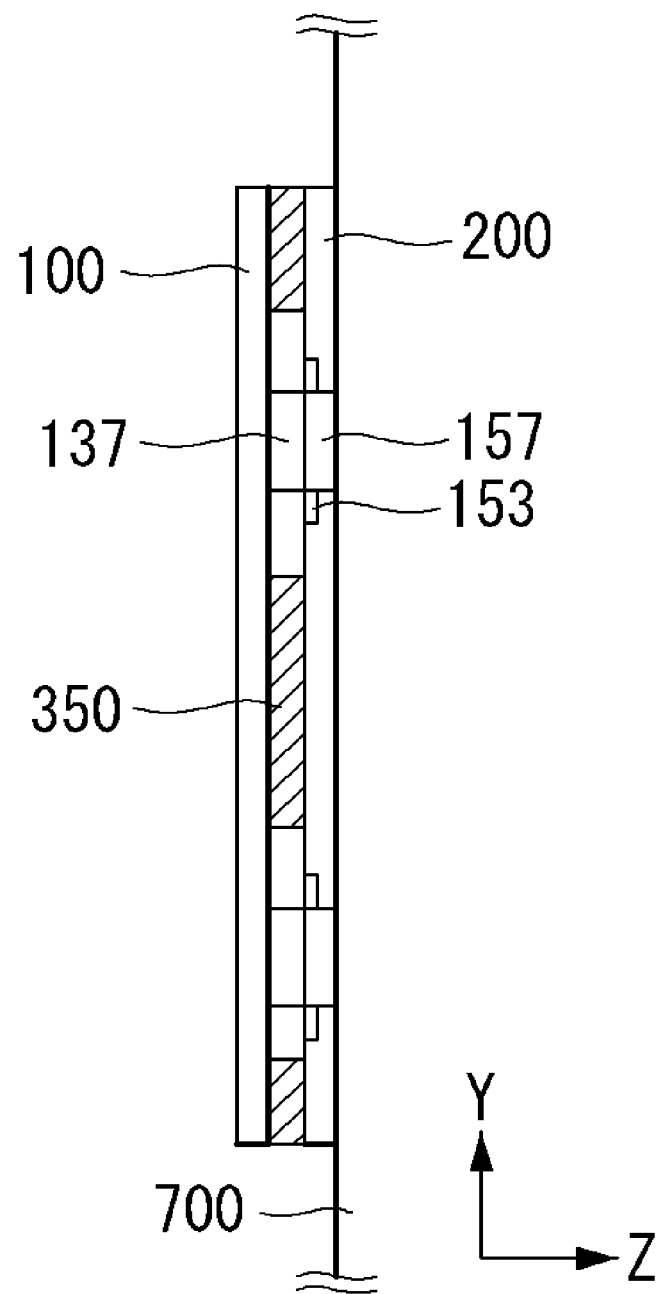
Figure 18C:
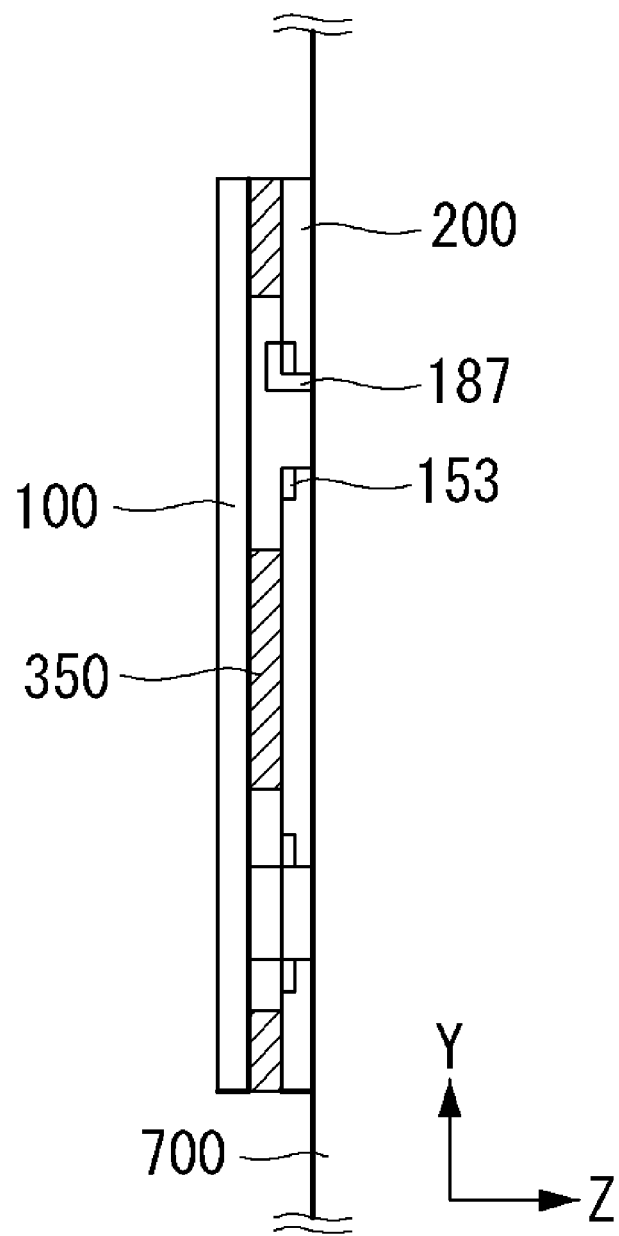

Referring to FIGS. 18(a), 18(b), and 18(c), the second coupling unit 157 may be placed in the central part of the to-be-attached surface 700 on the upper side thereof, and the hooks 187 may be placed on either side of the second coupling unit 157. The hooks 187 may include a first hook 187a placed on one side of the second coupling unit 157 and a second hook 187b placed on the other side of the second coupling unit 157 where each hook faces one side of the second coupling unit 157. The second coupling unit 157 and the first and the second hooks 187a and 187b may be spaced apart from each other.

As shown in FIG. 18(b), the first coupling unit 137 and the second coupling unit 157 may attach to each other by magnetism through the coupling hole 271 placed on the upper side of the back cover 200 in the first state. In this case, the first coupling unit 137 and the second coupling unit 157 may have different polarities. The second coupling unit 157 may be inserted into the coupling hole 271 and attached to the first coupling unit 137. Accordingly, the second coupling unit 157 may engage with the coupling hole 271 along with the hook 187 in addition to coupling by magnetism.

A coupling force between the body 10 and the to-be-attached surface 700 can be further enhanced because the second coupling unit 157 is extended lengthwise in the first direction.

As shown in FIG. 18(c), the first and the second hooks 187a and 187b may be coupled on either side of the coupling hole 271 placed on the upper side of the back cover 200 in the first state. The first and the second hooks 187a and 187b may come into contact with the bracket 153 on the upper side of the coupling hole 271. The bracket 153 may prevent a crack from being formed in the back cover 200 in the surroundings of the coupling hole 271. Accordingly, the bracket 153 can reinforce the stiffness of the surroundings of the coupling hole 271.

In the display device according to an embodiment of the present invention, the first and the second hooks 187a and 187b may be placed on either side on the to-be-attached surface 700 on the upper side thereof. Accordingly, the first and second hooks 187a and 187b can accurately guide either ends of the body 10 coupling to the to-be-attached surface 700.

Figure 19A:
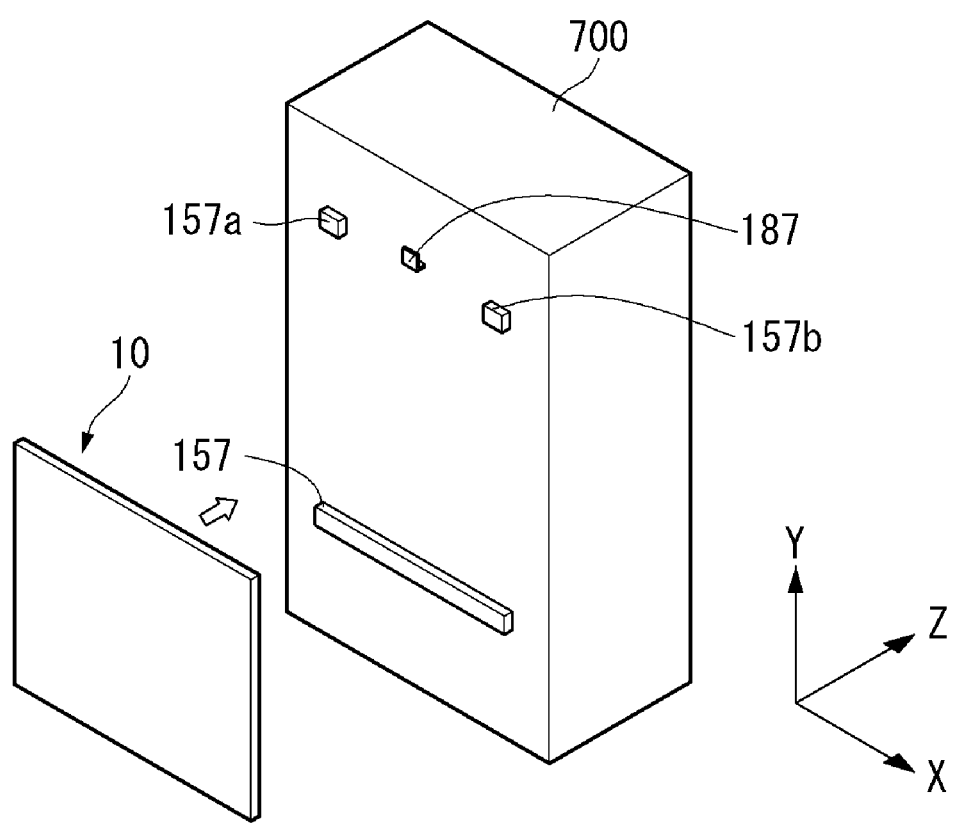
Figure 19B:
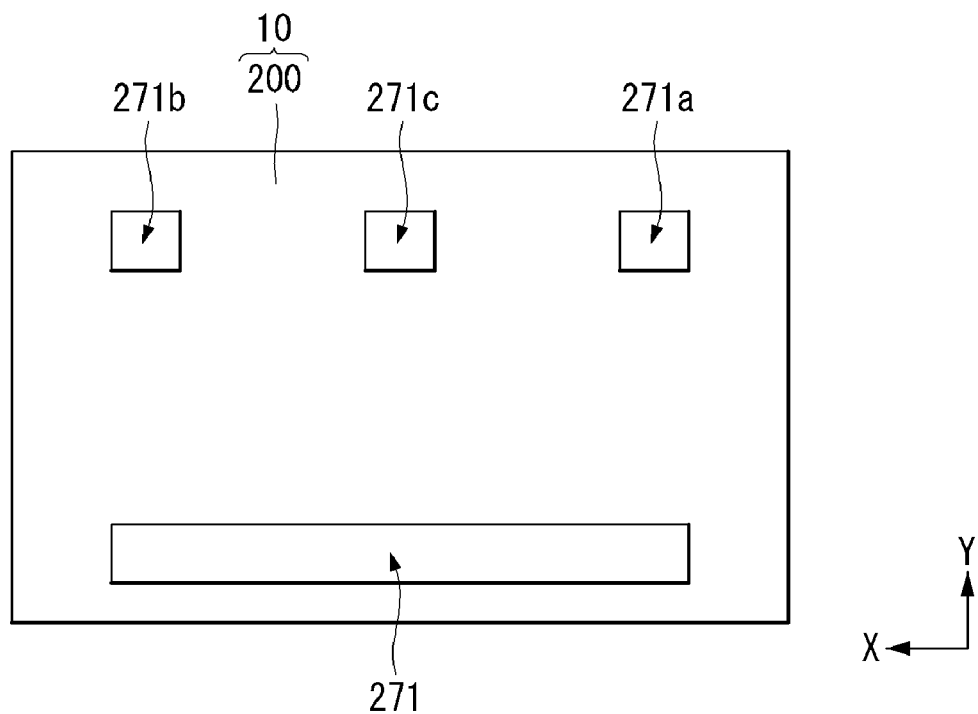

Referring to FIGS. 19(a) and 19(b), the hook 187 may be placed in the central part of the to-be-attached surface 700 on the upper side thereof, and the second coupling unit 157 may be placed on either side of the hook 187. The second coupling unit 157 may include a one-side coupling unit 157a placed on one side of the hook 187 and an other-side coupling unit 157b placed on the other side of the hook 187 where the one-side coupling unit 157a and other-side coupling unit 157b face one side of the hook 187. The hook 187 and the one-side and other-side coupling units 157a and 157b may be spaced apart from each other.

The one-side and other-side coupling units 157a and 157b may not extend in the first direction. That is, each of the one-side and other-side coupling units 157a and 157b may have a shape identical to or similar to a square. Accordingly, the one-side and other-side coupling units 157a and 157b may be placed in portions corresponding to the edge of the back cover 200 on one side thereof and the edge of the back cover 200 on the other side thereof in the first state.

In this case, the coupling hole 271 on the upper side of the back cover 200 may include first to third coupling holes 271a, 271b, and 271c. The first and the second coupling holes 271a and 271b may be placed on either side of the third coupling hole 271c with them spaced apart from each other. The first and the second coupling holes 271a and 271b may be portions into or to which the one-side and other-side coupling units 157a and 157b are inserted or closely attached in the first state. The first and the second coupling holes 271a and 271b are placed in portions corresponding to the one-side and other-side coupling units 157a and 157b in the first state. Each of the first and the second coupling holes 271a and 271b may also have a shape identical to or similar to a square because each of the one-side and other-side coupling units 157a and 157b has a shape identical to or similar to a square. The third coupling hole 271c may be placed in the central upper part of the back cover 200. The third coupling hole 271c may be a portion into which the hook 187 is inserted in the first state.

In the display device according to an embodiment of the present invention, each of the first and the second coupling holes 271a and 271b may have a shape identical to or similar to a square and may be spaced apart from the third coupling hole 271c at a specific distance. Accordingly, the location in which the body 10 may be coupled to the to-be-attached surface 700 can be guided more easily.

Figure 20:
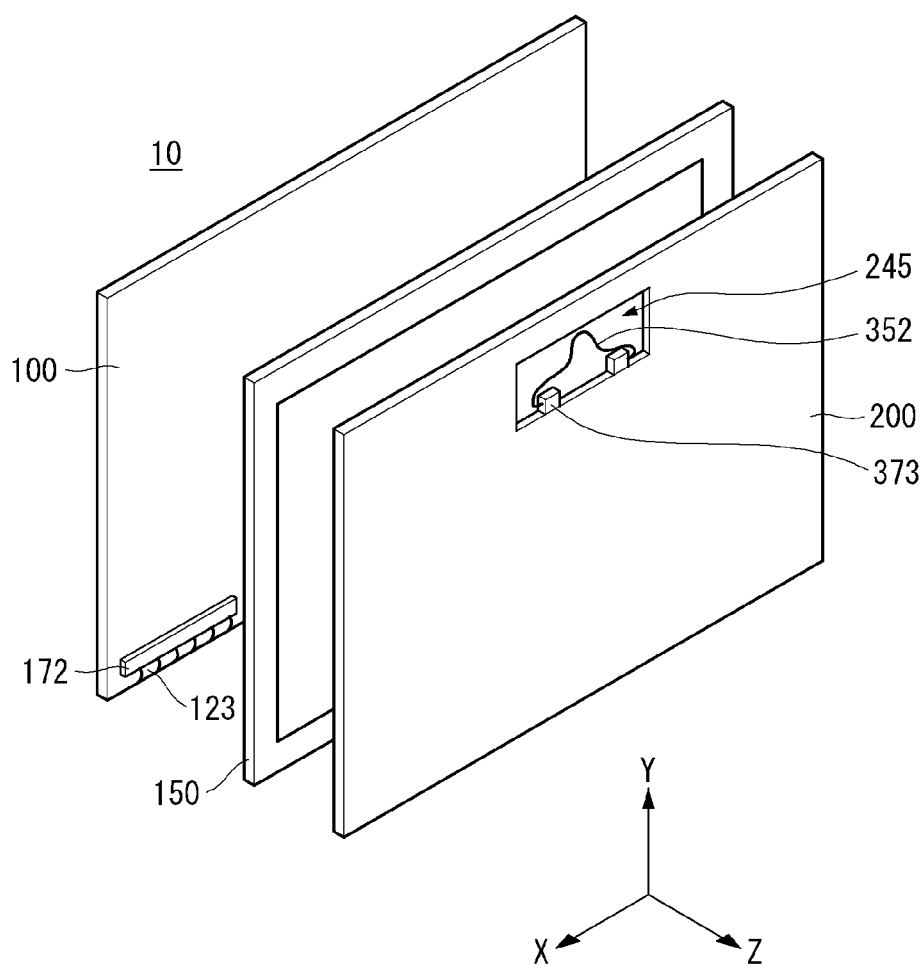
FIGS. 20, 21(a), 21(b), 22(a), 22(b), 22(c), 23(a), and 23(b) are diagrams showing a display device according to various embodiments of the present invention.
Figure 21A:
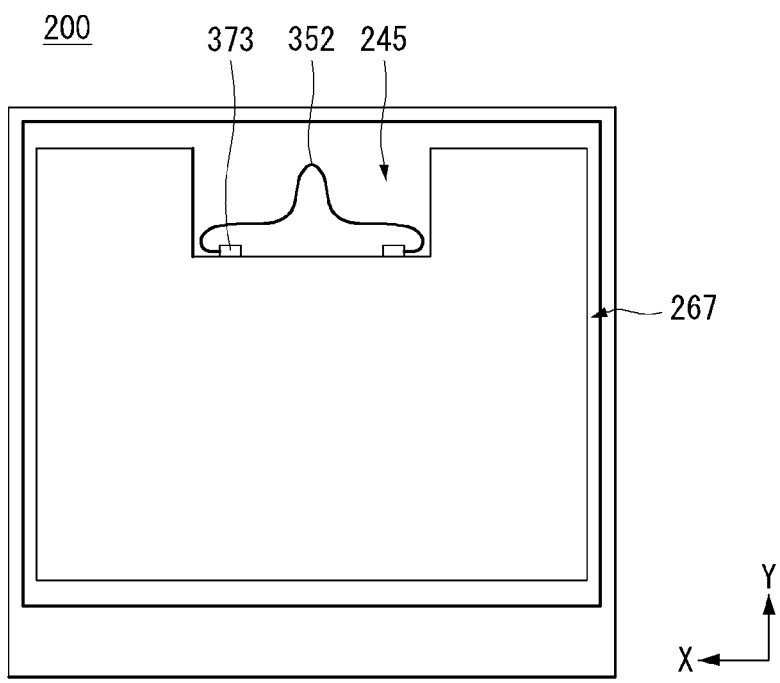
Figure 21B:
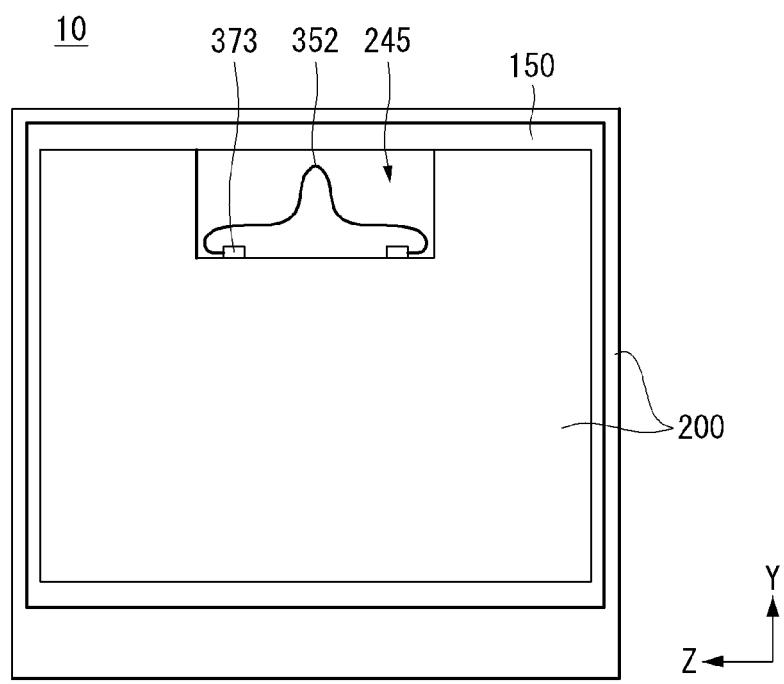

FIGS. 20, 21(*a*), 21(*b*), 22(*a*), 22(*b*), 22(*c*), 23(*a*), and 23(*b*) are diagrams showing a display device according to various embodiments of the present invention.

Referring to FIG. 20, the body 10 of the display device according to an embodiment of the present invention may include a display panel 100, a metal plate 150, and a back cover 200.

In the present embodiment, the metal plate 150 may be a frame provided in at least one part of the back surface of the display panel 100. The metal plate 150 may be provided at the edges of the back surface of the display panel 100. Thus, the central part of the metal plate 150 may be empty having a frame shape. The metal plate 150 may support the back surface of the display panel 100. This means that the metal plate 150 can reinforce the stiffness of the display panel 100.

For example, because the metal plate 150 includes a metal material, the metal plate 150 may allow the body 10 to be attached to a magnetic photo frame.

The back cover 200 may be provided to at least other parts of the display panel 100. That is, the back cover 200 may be provided in a portion in which the metal plate 150 is not placed.

In the present embodiment, the back cover 200 may include a transparent material. For example, the back cover 200 may include glass or tempered glass. Accordingly, a user may feel that the body 10 has a neat external appearance when seeing the body.

A coupling groove 245 may be placed in the central part of the back cover 200 on the upper side thereof. The coupling groove 245 may be a portion which penetrates the back cover 200. Lower hooks 373 and a hanger 352 may be provided within the coupling groove 271. The body 10 can be coupled to a wall more closely because the bottom hooks 373 and the hanger 352 are placed within the coupling groove 271.

Referring to FIGS. 21(*a*) and 21(*b*), the back cover 200 may include a main area and a surrounding area. The main area may be placed in the central part of the back cover 200. The surrounding area may have a shape surrounding the edge of the display panel 100. The main area and the surrounding area may be spaced apart from each other at a specific width. That is, the surrounding area may be spaced apart from the main area and may have a shape surrounding the main area.

A coupling through hole 267 may be formed in the space between the main area and the surrounding area. The coupling through hole 267 may be a portion in which the metal plate 150 is placed, as shown in FIG. 21(*b*). The metal plate 150 is placed within the coupling through hole 267. Accordingly, the width of the coupling through hole 267 may be greater than the width of the metal plate 150.

At least parts of the coupling through hole 267 and the coupling groove 245 may be connected. The upper side of the coupling groove 245 is open until the back cover 200 is coupled to the body 10.

When the back cover 200 is coupled to the body 10, the upper side of the coupling groove 245 may be blocked by the metal plate 150 placed in the coupling through hole 267. Accordingly, the coupling groove 245 may have an opening part shape having four sides blocked.

The width of the hanger 352 may be smaller than that of the coupling groove 245 in the second direction. Accordingly, if the hanger 352 is not used or is engaged with a top hook in the first state, the hanger 352 may be placed in the coupling groove 245 without protruding outwardly from the body 10.

In the display device according to an embodiment of the present invention, the coupling through hole 267 of the back cover 200 may be formed in the portion in which the metal plate 150 will be placed. Accordingly, the body 10 can have a thin thickness because the back cover 200 is not formed in the portion in which the metal plate 150 will be placed.

Figure 22A:
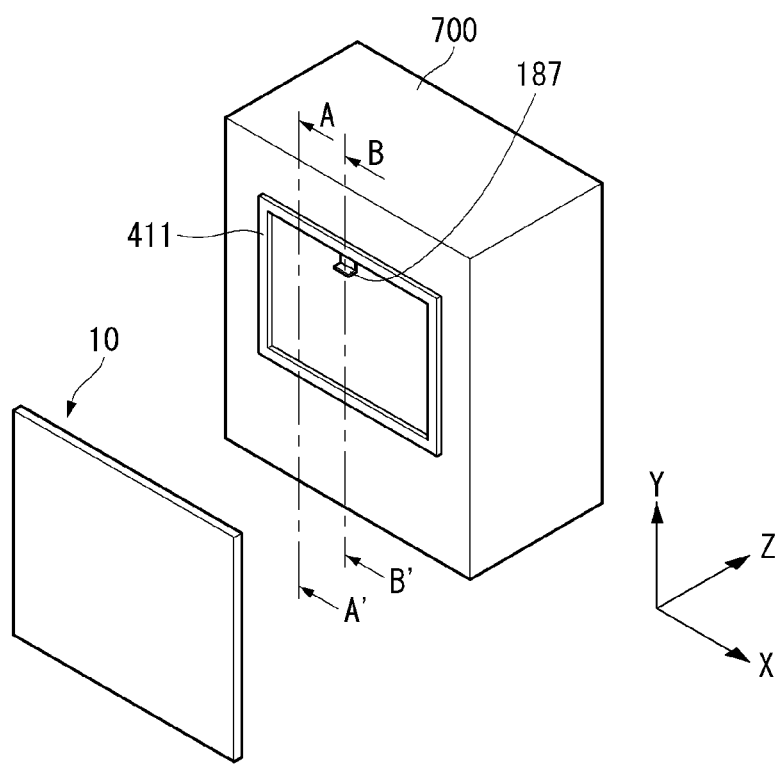
Figure 22B:
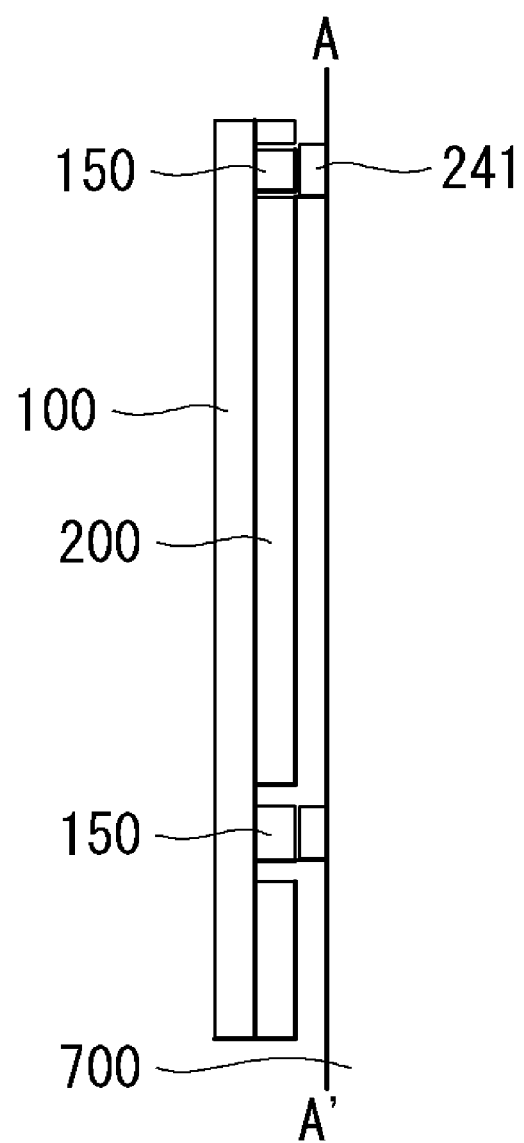
Figure 22C:
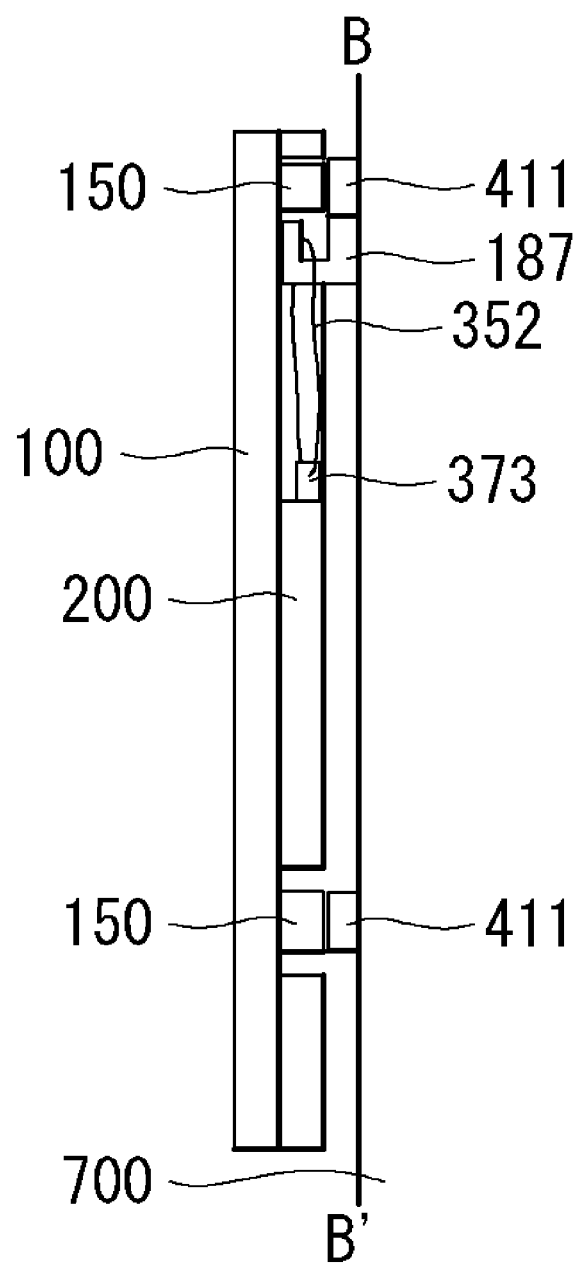

Referring to FIGS. 22(*a*), 22(*b*), and 22(*c*), in a display device according to an embodiment of the present invention, the body 10 may be coupled to a magnetic photo frame 411 attached to the to-be-attached surface 700. The magnetic photo frame 411 may be a rectangular frame shape having an opening in the interior. The magnetic photo frame 411 may include a magnetic material.

The metal plate 150 may be placed in a portion of the body 10 corresponding to the magnetic photo frame 411. The magnetic photo frame 411 may come into contact with the metal plate 150 in the first state. The magnetic photo frame 411 may be coupled to the metal plate 150 using magnetism in the first state.

The magnetic photo frame 411 may be coupled to the to-be-attached surface 700 using a screw, but the present invention is not limited thereto. For example, the magnetic photo frame 411 may be coupled to the to-be-attached surface 700 through welding, an adhesive sheet, or Velcro.

A top hook 187 may be placed at the bottom of the upper portion of the magnetic photo frame 411 in the central part thereof. The top hook 187 may come into contact with the upper portion of the magnetic photo frame 411. The top hook 187 may engage with the hanger 352 placed in the coupling groove 245 of the body 10 in the first state.

As shown in FIG. 22(*b*), the metal plate 150 and the magnetic photo frame 411 may be coupled. Accordingly, the body 10 may be spaced apart from the to-be-attached surface 700 by the protruded thickness of the magnetic photo frame 411. Accordingly, when the body 10 is attached to the to-be-attached surface 700, a crack in or damage to the body 10 attributable to an impact can be prevented.

As shown in FIG. 22(*c*), the hanger 352 fixed by the bottom hooks 373 at the body 10 may engage with the top hook 187 in the first state. The top hook 187 may be inserted into the coupling groove 245 in the first state. Accordingly, the hanger 352 does not protrude to the outside of the back cover 200 in the first state. A user may feel that an external appearance is neat because the hanger 352 does not protrude to the outside of the back cover 200. Furthermore, the body 10 and the to-be-attached surface 700 can be coupled more strongly because they are coupled by the top hook 187 in addition to magnetism.

Figure 23A:
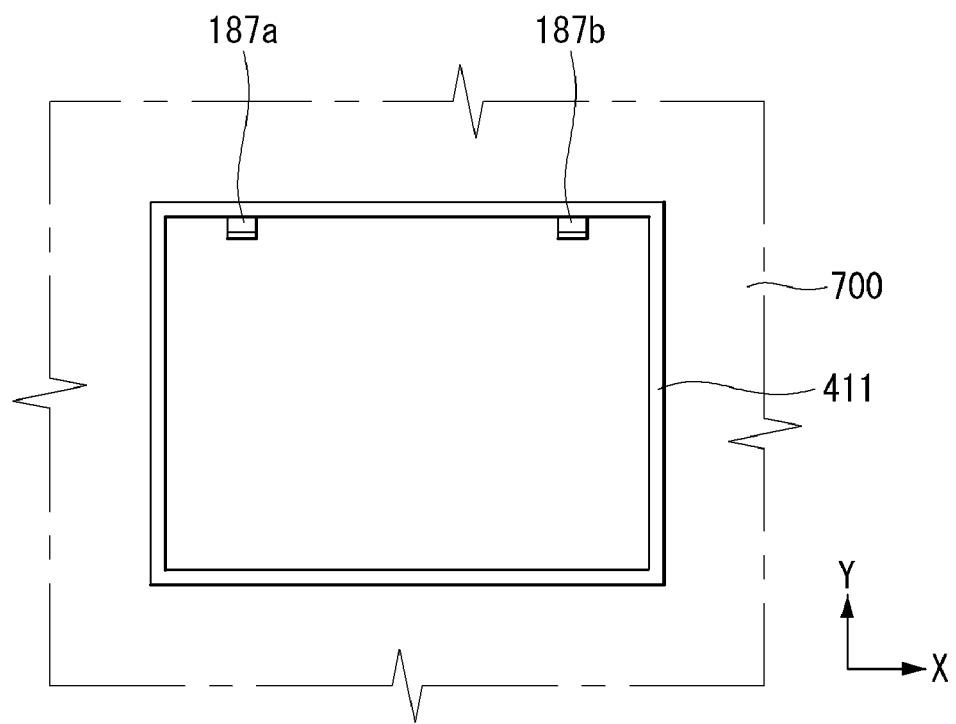

Referring to FIGS. 23(*a*) and 23(*b*), as shown in FIG. 23(*a*), in a display device according to an embodiment of the present invention, the top hook 187 may include a first top hook 187*a* and a second top hook 187*b* at the bottom of the upper portion of the magnetic photo frame 411 on either side thereof. The first top hook 187*a* may be placed at the bottom of the upper portion of the magnetic photo frame 411 on one side thereof, and the second top hook 187*b* may be placed on the other side of the upper portion of the magnetic photo frame 411 facing the first top hook 187*a* in the second direction.

In this case, the two hangers of the body may be placed in portions corresponding to the first and the second top hooks 187*a* and 187*b*. A coupling force between the body and the to-be-attached surface 700 can be further increased because the two hangers are coupled to the first and the second top hooks 187a and 187b.

Figure 23B:
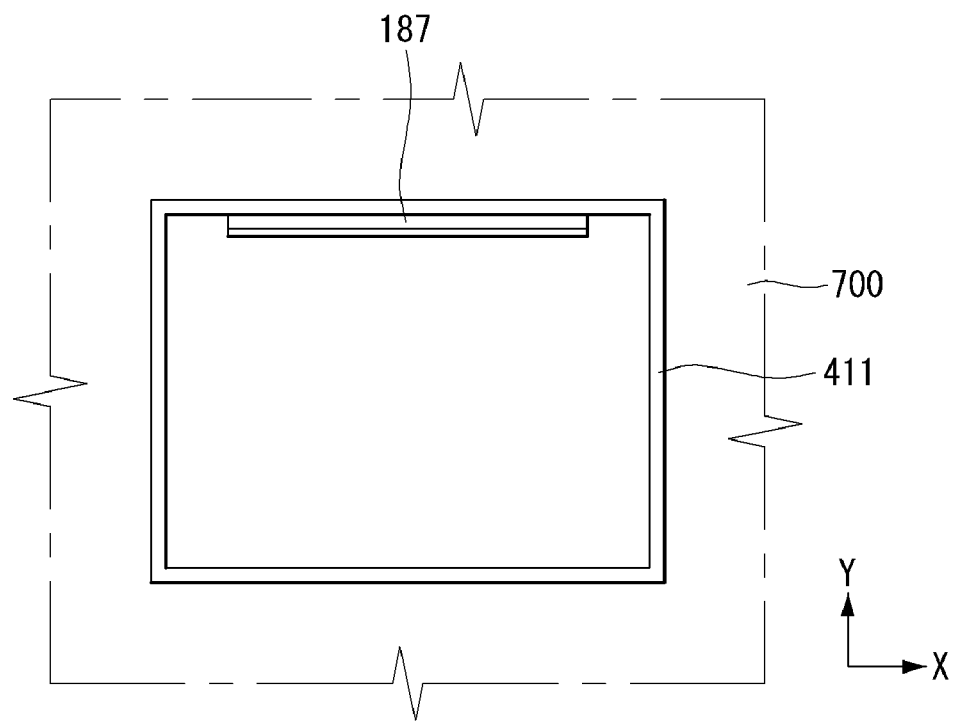

As shown in FIG. 23(b), in a display device according to an embodiment of the present invention, the top hook 187 placed at the bottom of the upper portion of the magnetic photo frame 411 in the central part thereof may be extended in the first direction. The length of the top hook 187 in the second direction may be similar to the length of the upper portion of the magnetic photo frame 411 in the second direction.

Since the top hook 187 is placed at the bottom of the upper portion of the magnetic photo frame 411, there may be no influence on a coupling force according to the magnetism of the body and the to-be-attached surface 700. A contact area between the hanger and the top hook 187 in the first state is further increased because the top hook 187 is extended lengthwise in the second direction. This means that the hanger and the top hook 187 can be coupled more stably in the first state. Accordingly, a coupling force between the body and the to-be-attached surface 700 can be increased.

FIGS. 24, 25(a), 25(b), 26(a), 26(b), 27(a), 27(b), 27(c), 28(a), 28(b), 29(a), 29(b), 30(a), and 30(b) are diagrams showing a display device according to various embodiments of the present invention.

Figure 24:
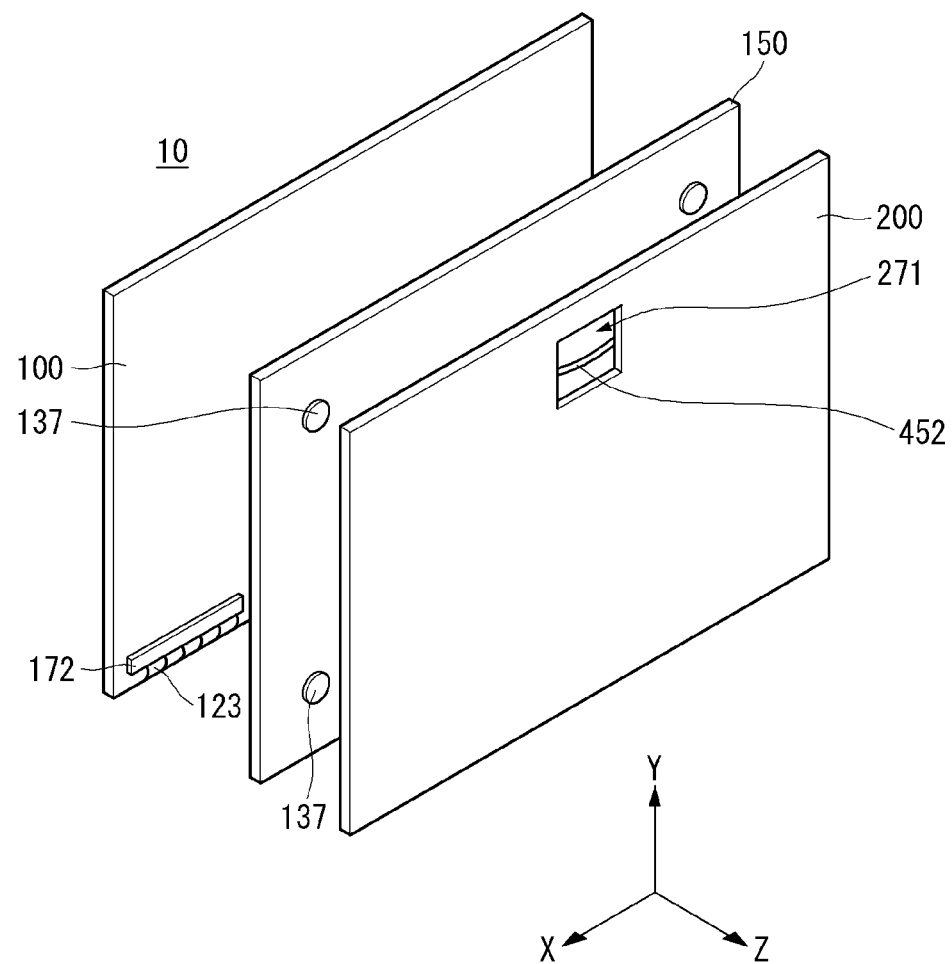

Referring to FIG. 24, in the display device according to an embodiment of the present invention, the central part of a metal plate 150 may not be open. That is, the metal plate 150 may be a rectangular shape rather than a frame shape.

The metal plate 150 may be placed in the back surface of a display panel 100 and may have a smaller width than the display panel 100. Accordingly, the metal plate is not visible from the sides of the display panel 100 and a user can focus his or her attention on a display screen.

The first coupling units 137 of the metal plate 150 may be placed in the four vertex portions of the back surface of the metal plate 150. The first coupling units 137 may protrude in the back surface direction (third direction) from the metal plate 150. The first coupling unit 137 may include a magnetic material. A method for coupling the first coupling units 137 and the metal plate 150 is described later.

A back cover 200 may be provided in the back surface of the metal plate 150. A coupling hole 271 may be placed in the central part of the back cover 200 on the upper side thereof. The coupling hole 271 may penetrate the back cover 200. The coupling hole 271 may have a square or a shape similar to a square.

A wire 452 may be provided at the back cover 200 with the wire 452 interposed between the coupling hole 271 and the back cover 200. Thus, the wire 452 may not be exposed when viewed from the side or front of the body 10 because it is placed at the back cover 200. One end and the other end of the wire 452 may be provided on both sides of the coupling hole 271 at the back cover 200. The wire 452 may engage with a hook inserted into the coupling hole 271. Accordingly, the body 10 can be closely coupled to the to-be-attached surface.

Figure 25A:
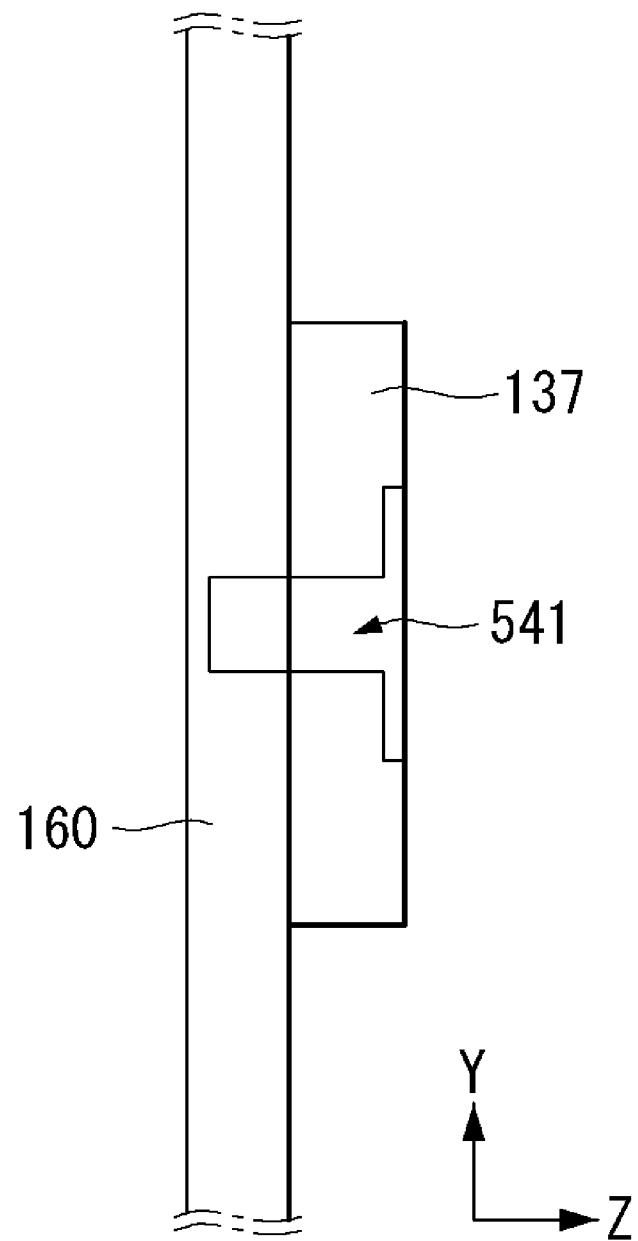
Figure 25B:
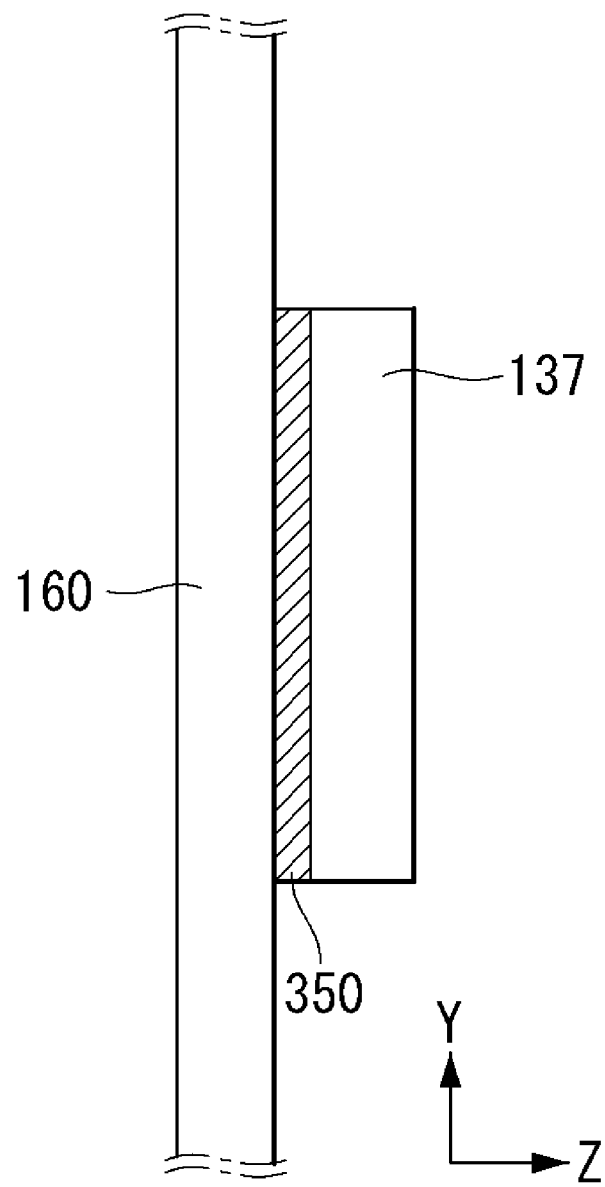

Referring to FIGS. 25(a) and 25(b), the first coupling unit 137 of the display device according to an embodiment of the present invention may be coupled to the back surface of the metal plate 150.

As shown in FIG. 25(a), the first coupling unit 137 may be coupled to the metal plate 150 through at least one hole 541 using a screw. In this case, the first coupling unit 137 and the metal plate 150 can be coupled strongly.

In an alternative embodiment, as shown in FIG. 25(b), the first coupling unit 137 may be coupled to the metal plate 150 through an adhesive sheet 350. If the first coupling unit 137 is coupled to the metal plate 150 using the adhesive sheet 350, cost can be reduced compared to coupling using another method.

The metal plate 150 and the first coupling unit 137 have been illustrated as being coupled using the two coupling methods, but the present invention is not limited thereto. For example, the metal plate 150 and the first coupling unit 137 may be coupled using Velcro or welding.

Figure 26A:
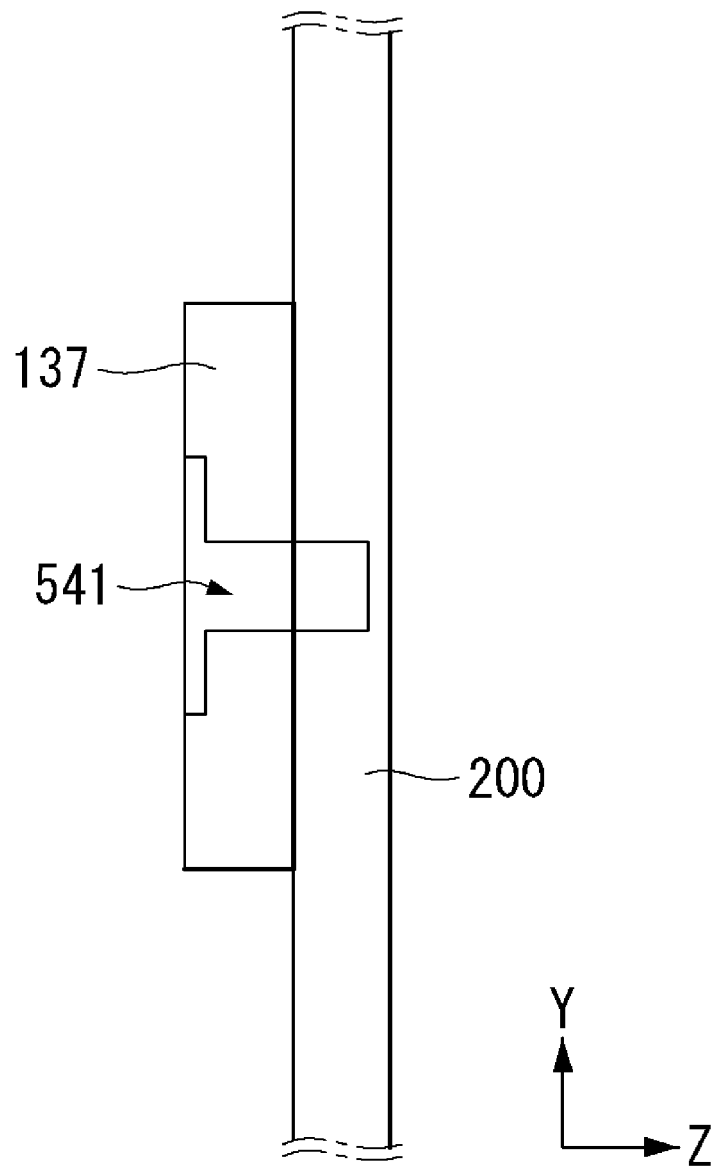

Referring to FIGS. 26(a) and 26(b), the first coupling unit 137 of the display device according to an embodiment of the present invention may be coupled to the front surface of the back cover 200 other than the back surface of the metal plate 150.

As shown in FIG. 26(a), the first coupling unit 137 may be coupled to the back cover 200 through at least one hole 541 using a screw. In this case, the first coupling unit 137 and the back cover 200 can be strongly coupled.

In an alternative embodiment, as shown in FIG. 26(b), the first coupling unit 137 may be coupled to the back cover 200 through an adhesive sheet 350. If the first coupling unit 137 is coupled to the back cover 200 using the adhesive sheet 350, cost can be reduced compared to coupling using another method.

The back cover 200 and the first coupling unit 137 have been illustrated as being coupled using the two coupling methods, but the present invention is not limited thereto. For example, the back cover 200 and the first coupling unit 137 may be coupled using Velcro or welding.

The distance between the first coupling units 137 and a to-be-attached surface can be further reduced in the first state because the first coupling units 137 are coupled to the front surface of the back cover 200 other than the back surface of the metal plate. Accordingly, a coupling force between the body and the to-be-attached surface can be further increased.

Figure 27A:
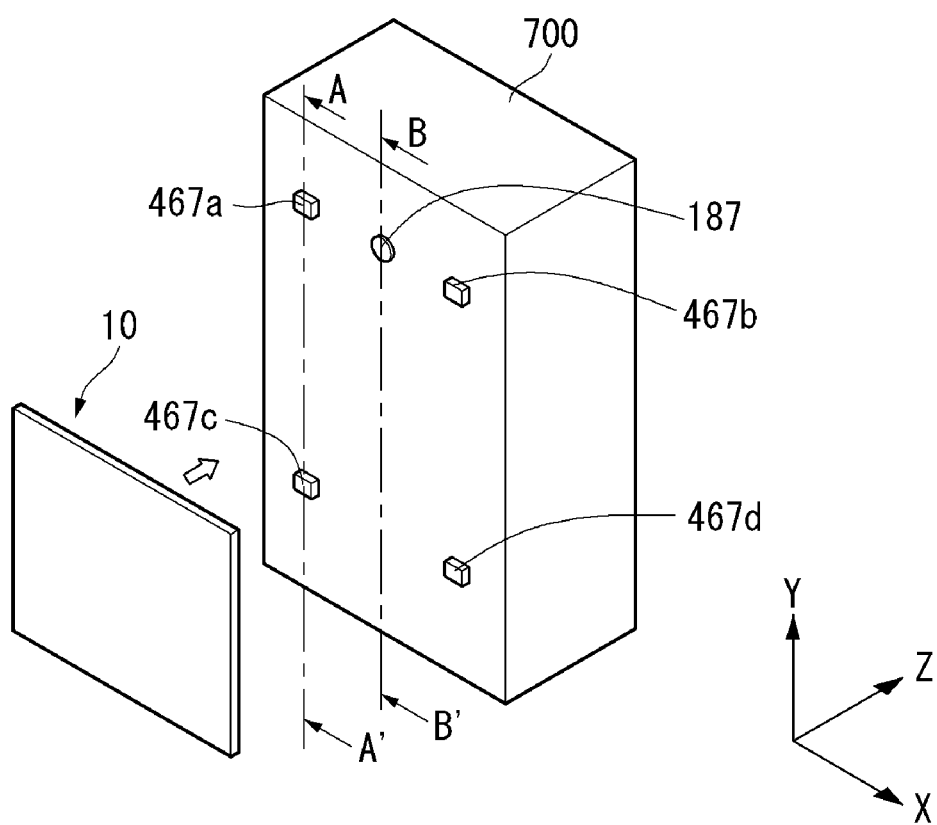
Figure 27B:
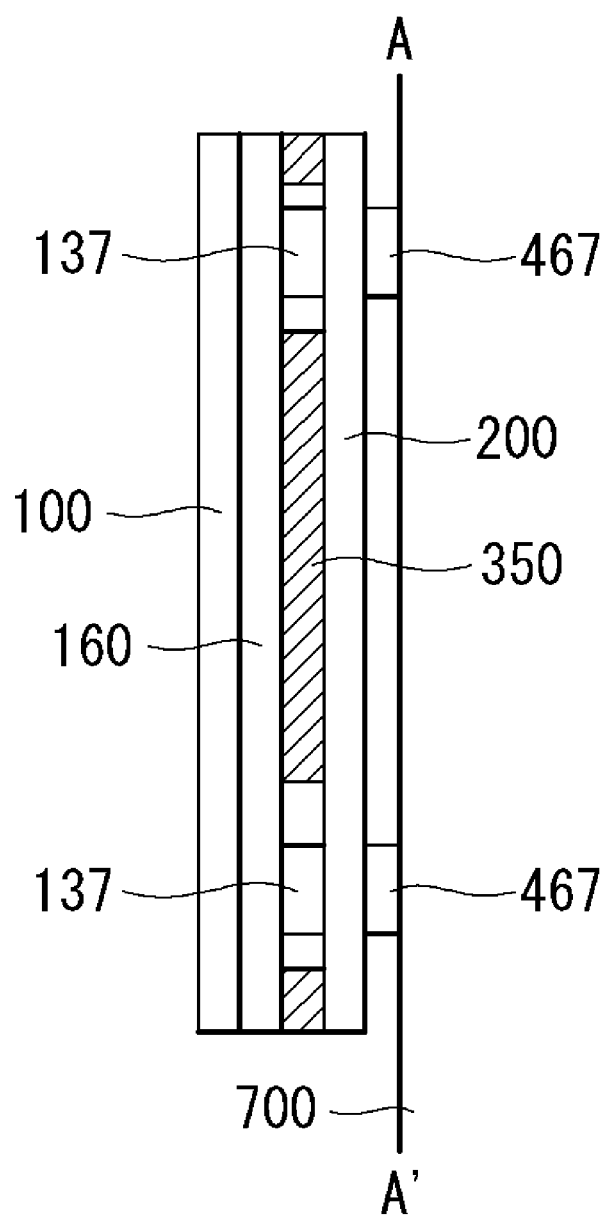
Figure 27C:
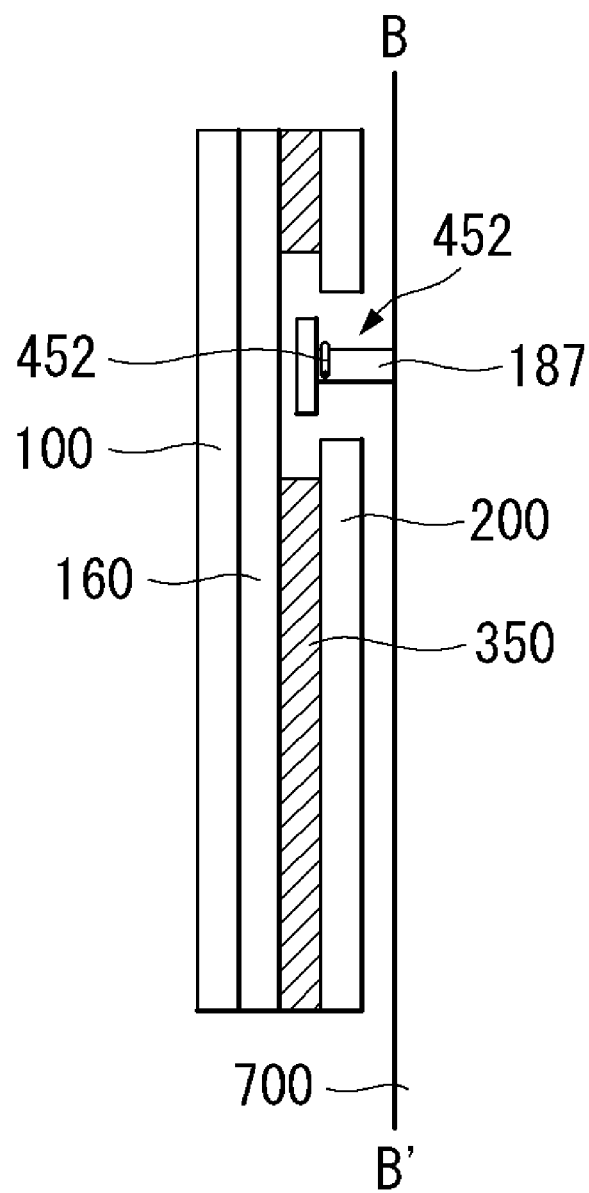

Referring to FIGS. 27(a), 27(b), and 27(c), in a display device according to an embodiment of the present invention, the hook 187 may be attached to the central part of the to-be-attached surface 700 on the upper side thereof, and first to fourth coupling sheets 467a to 467d may be attached to both sides of the to-be-attached surface 700 on the upper side thereof and both sides of the to-be-attached surface 700 on the lower side thereof.

The first to fourth coupling sheets 467a to 467d may be placed in respective portions corresponding to the first coupling units 137 of the body 10 in the first state. The first to fourth coupling sheets 467a to 467d may include metal materials in order to be coupled to the first coupling units 137, but the present invention is not limited thereto. For example, the first to fourth coupling sheets 467a to 467d may include magnetic materials. In this case, each of the first to fourth coupling sheets 467a to 467d may include a material having a polarity opposite the polarity of the material of the first coupling unit 137.

As shown in FIG. 27(b), the first coupling unit 137 may be coupled to the coupling sheet 467 with the back cover 200 interposed therebetween. A user may feel that the body 10 has a neater external appearance because the first coupling units 137 are shielded by the back cover 200.

As shown in FIG. 27(c), the hook 187 placed in the central part of the to-be-attached surface 700 on the upper side thereof may be inserted into the coupling hole 271 in the first state. The wire 452 placed on the front side of the back cover 200 may engage with the hook 187 in the first state. The wire 452 may be tightly coupled to the back cover 200 so that the body 10 does not downwardly droop in the first state. It is desirable that the wire 452 is tightly coupled, so that the drooping of the body 10 may be prevented.

Figure 28A:
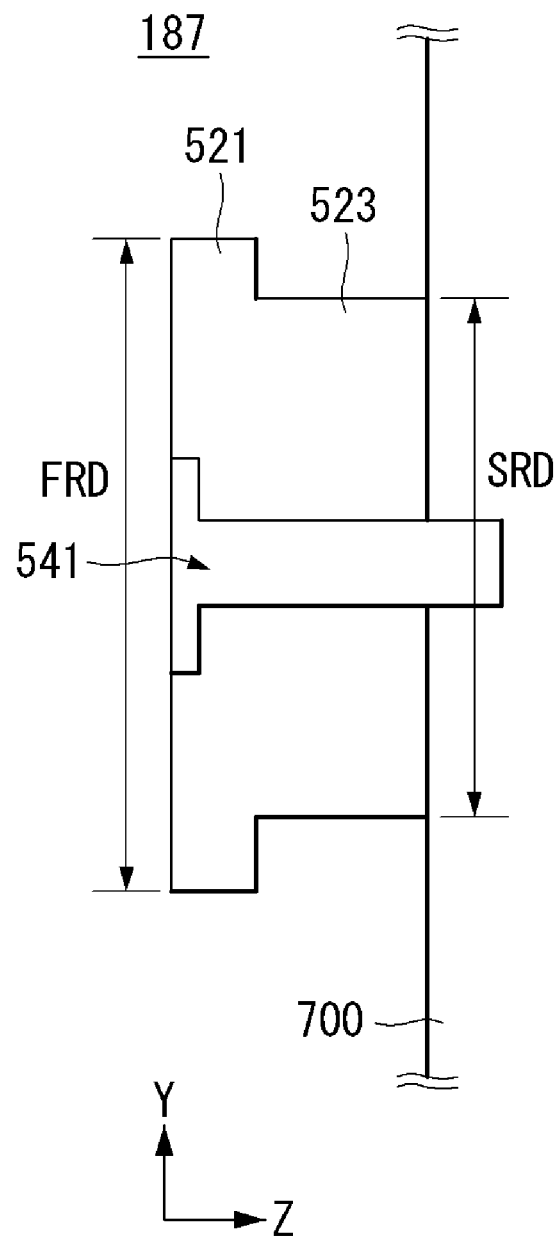
Figure 28B:
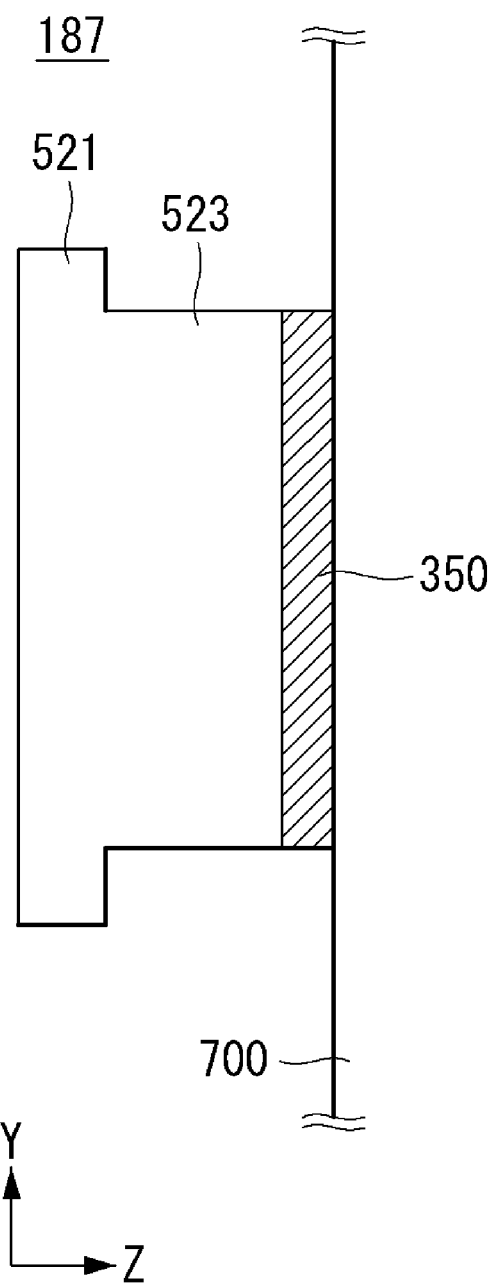

Referring to FIGS. 28(a) and 28(b), the hook 187 may include a first diameter portion 521 and a second diameter portion 523. The hook 187 may have a cylindrical shape. The diameter FRD of the first diameter portion 521 may be different from the diameter SRD of the second diameter portion 523. For example, the diameter FRD of the first diameter portion 521 may be greater than the diameter SRD of the second diameter portion 523.

The hook 187 can be engaged with the wire 452 more easily without being separated from the wire because it includes the first diameter portion 521 and the second diameter portion 523 having different diameters.

As shown in FIG. 28(a), the hook 187 may be coupled to the to-be-attached surface 700 through at least one hole 541 using a screw. In this case, the hook 187 and the to-be-attached surface 700 may be coupled more strongly.

In an alternative embodiment, as shown in FIG. 28(b), the hook 187 may be coupled to the to-be-attached surface 700 through an adhesive sheet 350. If the adhesive sheet 350 is coupled to the to-be-attached surface 700 using the adhesive sheet 350, cost can be reduced compared to coupling using another method.

The to-be-attached surface 700 and the hook 187 have been illustrated as being coupled using the two coupling methods, but the present invention is not limited thereto. For example, the to-be-attached surface 700 and the hook 187 may be coupled using Velcro or welding.

Figure 29A:
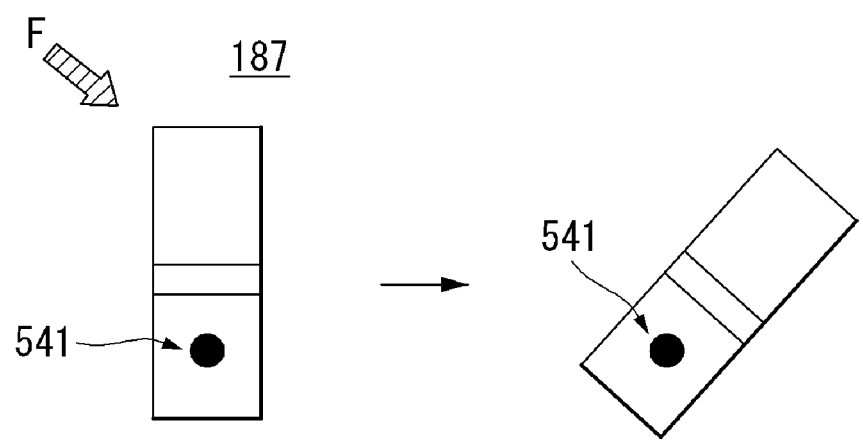
Figure 29B:
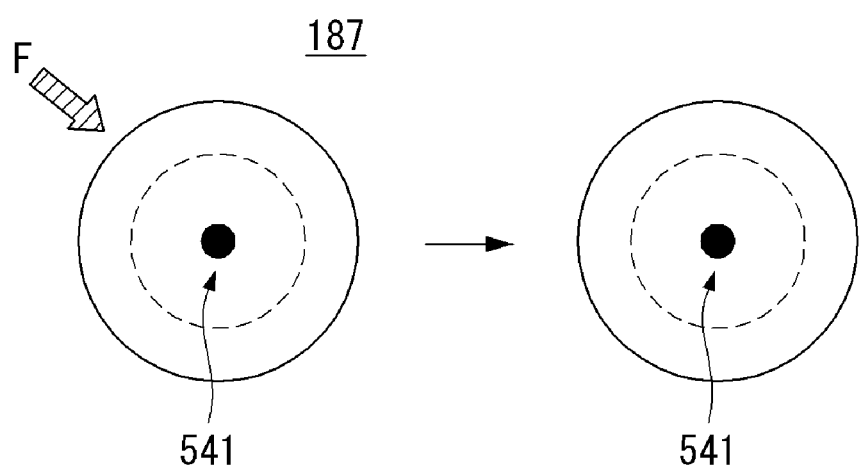

Referring to FIGS. 29(a) and 29(b), the hook 187 according to the present embodiment may have a cylindrical shape including two portions having different diameters.

As shown in FIG. 29(a), if the hook 187 has a shape extended in one direction, the hook 187 may be inclined toward the direction in which an external force is applied when the external force is applied to one side of the hook. In this case, a coupling force between the hook 187 and the body may become weak. In severe cases, the hook 187 may not be coupled to the body.

In an alternative embodiment, as shown in FIG. 29(b), if the hook 187 has a cylindrical shape, there may be no change in the hook 187 because the hook 187 has the same shape in all directions although an external force is applied to one side of the hook 187. Accordingly, the coupling force of the hook 187 may not be changed by external force.

In the display device according to an embodiment of the present invention, the hook 187 may have a cylindrical shape. Accordingly, a coupling force between the body and the hook 187 can be maintained even after a long period of time because the hook 198 is not subjected to the influence of an external force.

Figure 30A:
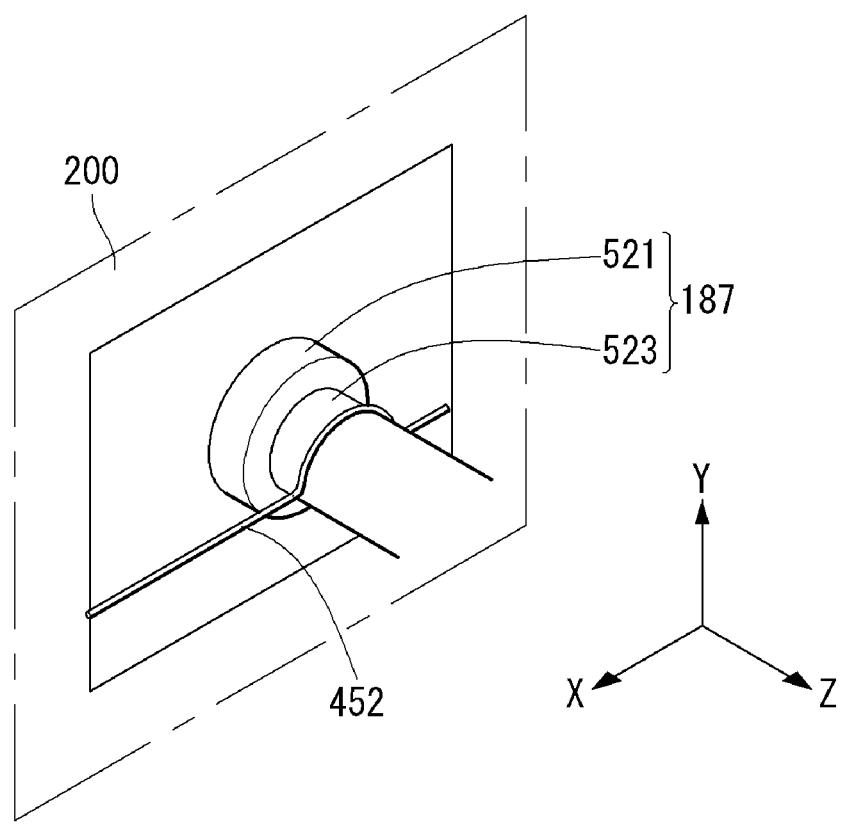
Figure 30B:
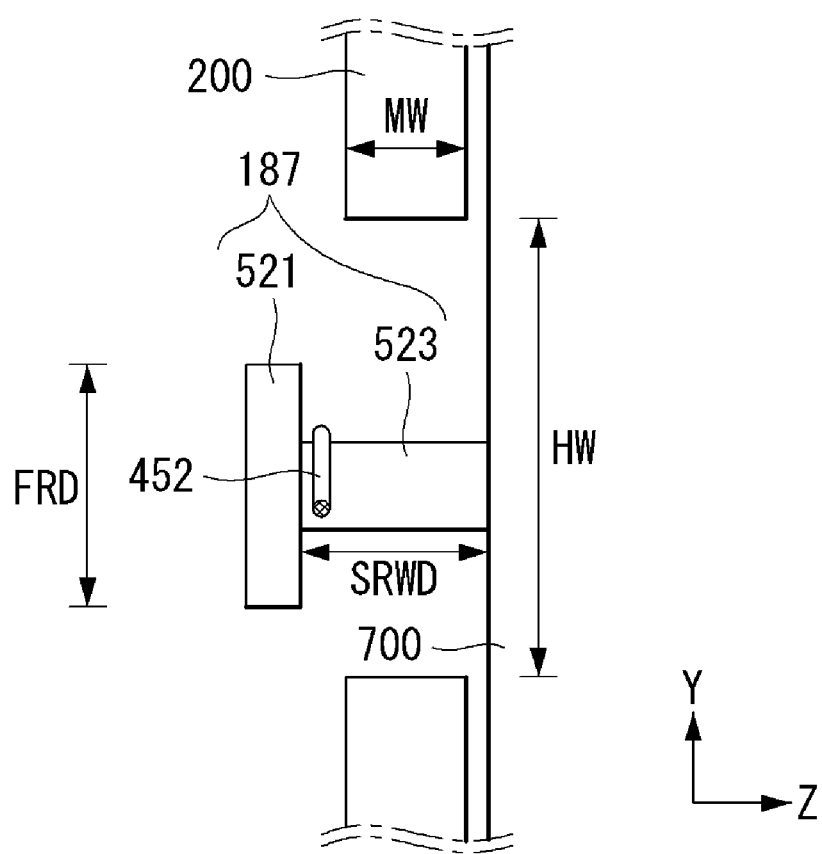

Referring to FIGS. 30(a) and 30(b), in a display device according to an embodiment of the present invention, the first diameter portion 521 of the hook 187 may be inserted into the coupling hole 271 in the first state.

The wire 452 may extend over the second diameter portion 523 of the hook 187 in the first state. The wire 452 may not separate from the hook 187 due to the first diameter portion 521 of the hook 187.

As shown in FIG. 30(b), the width HW of the coupling hole 271 in the second direction may be greater than the diameter FRD of the first diameter portion 521. If the diameter FRD of the first diameter portion 521 is greater than the width HW of the coupling hole 271 in the second direction, the hook 187 may not be inserted into the coupling hole 271 in the first state.

Furthermore, the distance SRWD of the second diameter portion 523 in the third direction may be greater than the width MW of the back cover 200 in the third direction. Since the wire 452 is placed in the front surface of the back cover 200, the wire 452 may be hung on the second diameter portion 523 when the end of the second diameter portion 523 is placed in the front surface of the back cover 200.

In the display device according to an embodiment of the present invention, the second diameter portion 523 of the hook 187 inserted into the coupling hole 271 may be hung on the wire 452. Accordingly, the body and the to-be-attached surface 700 can be closely coupled because the hook 187 is hung on the wire 452 in the state in which the hook 187 has been inserted into the coupling hole 271.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
a display panel;
a back cover positioned at a rear of the display panel, the back cover including an opening adjacent to a first edge of the display panel;
a frame configured to be attached to a surface, the frame positioned at a rear of the back cover, the frame including a hook inserted into the opening of the back cover; and
a coupling unit placed at the back cover,
wherein the coupling unit is magnetically coupled with the frame,
wherein a first portion of the coupling unit is positioned adjacent to a second edge of the display panel, and
wherein the second edge of the display panel is opposite to the first edge of the display panel.

2. The display device of claim 1, wherein the first edge of the display panel is positioned above the second edge of the display panel.

3. The display device of claim 2, wherein the hook includes a plurality of hooks arranged alongside of the first edge.

4. The display device of claim 3, wherein the opening includes a plurality of openings corresponding to the plurality of hooks.

5. The display device of claim 4, wherein the plurality of openings include a first opening and a second opening, wherein the first opening is positioned in a left portion of the back cover, and wherein the second opening is positioned in a right portion of the back cover.

6. The display device of claim 5, wherein the plurality of hooks include a first hook and a second hook, wherein the first hook is inserted into the first opening, and wherein the second hook is inserted into the second opening.

7. The display device of claim 6, wherein the first opening is symmetric with the second opening.

8. The display device of claim 1, wherein a second portion of the coupling unit is positioned between the first edge of the display panel and the first portion of the coupling unit.

9. The display device of claim 1, wherein the coupling unit includes a magnet.

10. The display device of claim 9, wherein the frame includes at least one of a magnet and a metal.

11. The display device of claim 1, wherein the hook includes a first diameter portion and a second diameter portion, wherein the second diameter portion is positioned between the first diameter portion and the surface, and wherein a diameter of the first diameter portion of greater than a diameter of the second portion.

12. The display device of claim 11, the first diameter portion is extended from the second diameter portion.

13. The display device of claim 12, wherein the first diameter portion has a cylindrical shape, and wherein an axis of the first diameter portion is in a direction from the surface to the display panel.

14. The display device of claim 13, wherein the second diameter portion has a cylindrical shape, and wherein an axis of the second diameter portion is in the direction from the surface to the display panel.

15. The display device of claim 14, wherein the first diameter portion is coaxial with the second diameter portion.

16. The display device of claim 15, wherein the hook forms a hole into which a screw is fitted.

17. The display device of claim 1, wherein the opening is elongated along the first edge of the display panel.

18. The display device of claim 1, wherein the hook is elongated along the first edge of the display panel.

19. The display device of claim 1, wherein the first portion of the coupling unit is elongated along the second edge of the display panel.

20. The display device of claim 1, wherein the opening is positioned above the first portion of the coupling unit.

* * * * *